(12) United States Patent
Masumoto et al.

(10) Patent No.: US 6,456,143 B2
(45) Date of Patent: Sep. 24, 2002

(54) FREQUENCY MULTIPLIER CIRCUIT AND SEMICONDUCTOR INTEGRATED CIRCUIT

(75) Inventors: Hiroshi Masumoto, Yokohama; Tsuneo Suzuki, Kamakura; Teruo Imayama, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/842,807

(22) Filed: Apr. 27, 2001

(30) Foreign Application Priority Data

Apr. 27, 2000 (JP) .................. 2000-127087
Nov. 30, 2000 (JP) .................. 2000-364648

(51) Int. Cl.$^7$ ............................... G06F 7/44
(52) U.S. Cl. .............. 327/356; 327/119; 327/122; 327/254; 327/255; 327/359
(58) Field of Search ................ 327/356, 357, 327/359, 119, 122, 231, 233, 235, 255, 254

(56) References Cited

U.S. PATENT DOCUMENTS 4,956,797 A * 9/1990 Berard .................. 327/231
5,436,938 A * 7/1995 Pigeon .................. 375/376
5,963,071 A * 10/1999 Dowlatabadi ........... 327/175
5,994,930 A * 11/1999 Park .................... 327/116
6,246,271 B1 * 6/2001 Takada et al. ........... 327/116

FOREIGN PATENT DOCUMENTS

| JP | 6-351033 | 12/1994 |
| JP | 7-235837 | 9/1995 |
| JP | 10-126156 | 5/1998 |

* cited by examiner

Primary Examiner—Timothy P. Callahan
Assistant Examiner—An T. Luu
(74) Attorney, Agent, or Firm—Oblon, Spivak, McClelland, Maier & Neustadt, P.C.

(57) ABSTRACT

A frequency multiplier circuit comprises: a source oscillator configured to generate a source oscillator signal using a crystal oscillator; and n frequency multiplier circuits (n is an integer which is 2 or more), each of which includes a 90° phase shifter circuit configured to shift the phase of an input signal by 90°, and a mixer configured to generate a doubled signal of the input signal on the basis of the input signal and an output signal of the 90° phase shifter circuit, wherein the n frequency multiplier circuits are cascade-connected, the source oscillation signal being inputted to a first stage frequency multiplier circuit of the n frequency multiplier circuits, and a final stage frequency multiplier circuit of the n frequency multiplier circuits outputting a signal having a frequency $2^n$ times as high as the frequency of the source oscillation signal.

30 Claims, 10 Drawing Sheets

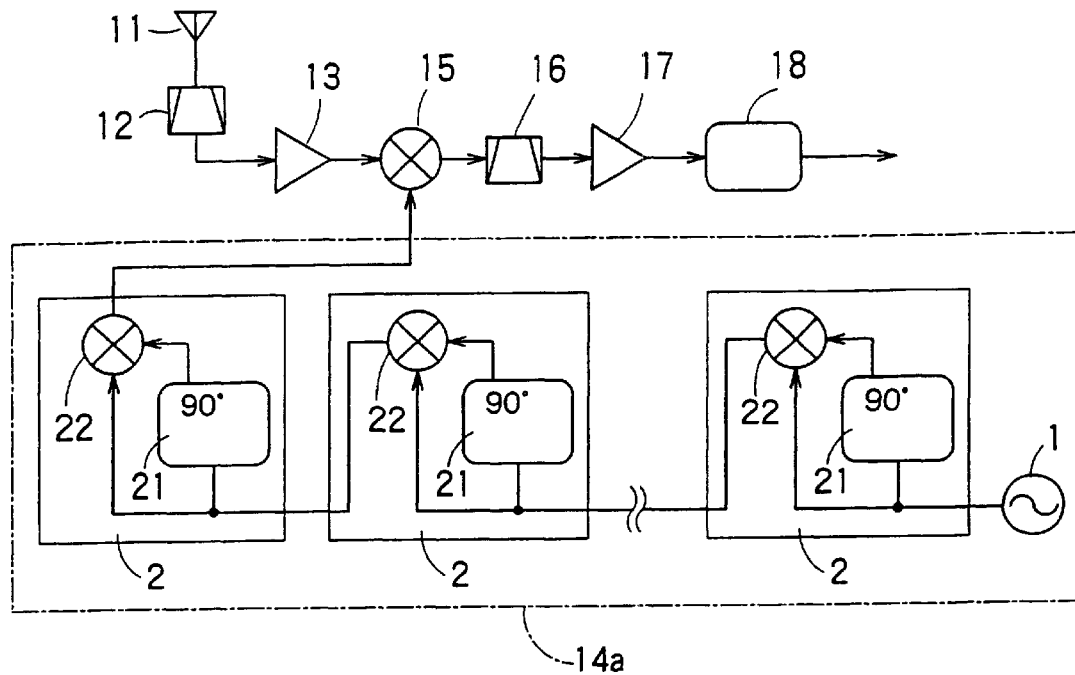
F I G. 1
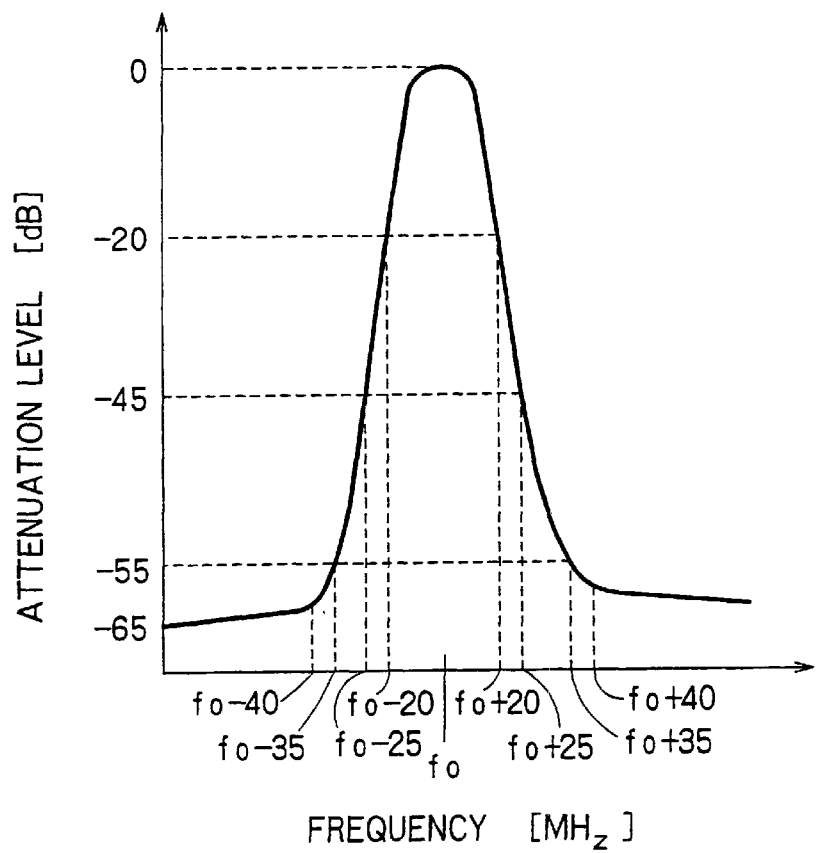
F I G. 2

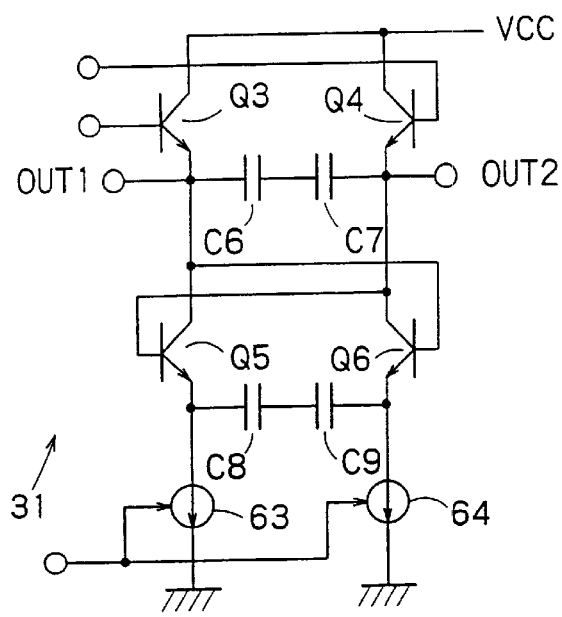
F I G. 7
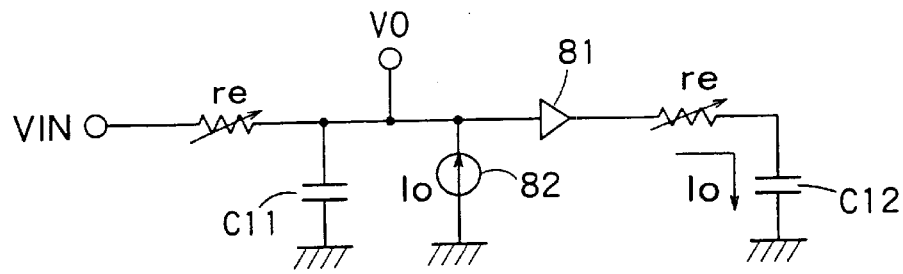
F I G. 8
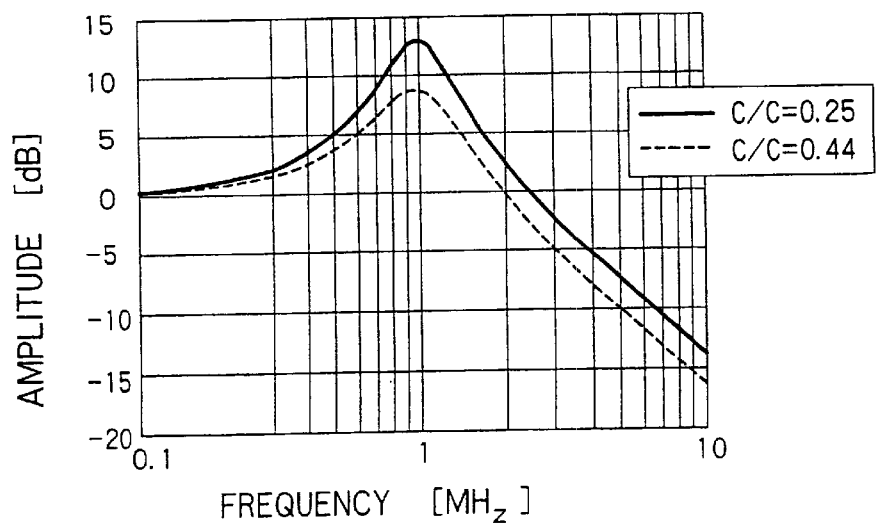
F I G. 9

FREQUENCY MULTIPLIER CIRCUIT AND SEMICONDUCTOR INTEGRATED CIRCUIT

CROSS REFERENCE TO RELATED APPLICATIONS

This application claims benefit of priority under 35USC §119 to Japanese Patent Application No. 2000-127087 filed on Apr. 27, 2000 and Japanese Patent Application No. 2000-364648 filed on Nov. 30, 2000, the entire contents of which are incorporated by reference herein.

BACKGROUND OF THE INVENTION

1. Field of the Invention

The present invention relates generally to a frequency multiplier and semiconductor integrated circuit for producing a local oscillation signal for use in a superheterodyne receiver or the like.

2. Related Background Art

Recently, there are provided various systems for sending and receiving weak radio waves to carry out various processes with non-contact. For example, a keyless entry system is designed to receive weak radio waves emitted from a transmitting circuit embedded in a key for a vehicle, by a receiving circuit in the vehicle to open and close doors and so forth.

FIG. 19 is a block diagram showing schematic configuration of a conventional weak radio wave sending/receiving system of this type. The system of FIG. 19 generally comprises a transmitter 51 and a receiver 52. The transmitter 51 has a transmitting circuit 53 and an antenna 54. The transmitter 51 uses a carrier frequency of 315 MHz to emit AM-modulated (amplitude-modulated) or FM-modulated (frequency-modulated) signals via the antenna 54.

The receiver 52 comprises an antenna 11, an SAW filter 12, an RF amplifier 13, a local oscillator circuit for generating a local oscillation signal, a mixer 15 for generating an intermediate frequency signal (IF signal), an IF filter 16, an IF amplifier 17 and a detector circuit 18. The local oscillator circuit 14 has a source oscillator circuit 21 for generating a reference signal, and a quintupler circuit 20 for outputting a quintupled signal having a frequency five times as high as that of the reference signal.

The source oscillator circuit 21 is designed to generate a source oscillation signal having a frequency of 65.14 MHz. The local oscillator circuit 14 is designed to generate a local oscillator signal $f_{LO}$=325.7 MHz which has an increased frequency five times as high as the frequency of the source oscillation signal. The mixer 15 is designed to use the local oscillation signal $f_{LO}$ to output an intermediate frequency signal having a frequency of $f_{LO}-f_O$=10.7 MHz.

Thus, a high frequency signal received by the antenna 11 is converted into an intermediate frequency signal by the mixer 15, so that the signal processing can be more easily carried out than a case of performing the signal processing by directly using the high frequency signal.

The IF filter 16, which is a band-pass filter, is connected to the subsequent stage mixer 15. The passing band of the filter 16 is about hundreds kHz centering on an intermediate frequency of 10.7 MHz. After undesired frequency components are removed by the IF filter 16, the intermediate frequency signals of 10.7 MHz are amplified by about 70 dB in the IF amplifier 17.

When the system of FIG. 19 is applied to the above described keyless entry system, the transmitter 51 is embedded in a key carried by a human, and the receiver 52 is mounted on a vehicle. From the transmitter 51, weak radio waves having the frequency of 322 MHz or less are emitted. An allowable field intensity is 500 µV/m or less which is defined by Article 6 of Enforcement Regulations of Radio Wave Law in Japan. Radio waves having the frequency of 322MHz or higher can be used. However, the allowable field intensity from 322 MHz to 10 GHz is 35 µV/m or less which is very small. In addition, as the frequency increases, the progressivity of radio waves increases so as not to be put to practical use, so that the radio waves having a frequency of 322 MHz or higher are hardly used in the country. Therefore, radio waves having a frequency of about 315 MHz are generally used as weak radio waves.

On the other hand, the transmitter 51 preferably has smaller electric power consumption in order to increase the life of a battery, so that it is required to simplify the circuit construction. For example, an SAW vibrator is known as a simple element capable of oscillating radio waves having a frequency of about 315 MHz. This element can not only simplify the circuit construction, but it can also directly oscillate by a frequency of 315 MHz.

Although there is a crystal oscillator as another oscillator element, it is technically difficult to directly oscillate the signal having a frequency of about 315 MHz. After oscillating the crystal oscillator at a low frequency, it is required to multiply frequency. Because of this, the SAW vibrator is often used to constitute the circuit as simple as possible.

However, there is a problem in that the SAW vibrator has a large frequency deviation. The frequency deviation of the SAW vibrator is usually 100 ppm or higher. The frequency deviation of the transmitter itself grows worse if the SAW vibrator is used as the transmitter. Because of this, when the performance and yields of products are intended to be improved, a crystal oscillator is sometimes used.

When the SAW vibrator is used as the transmitter, it is required to improve the frequency precision on the side of the receiver in order to compensate its disadvantages. In order to improve the frequency precision, a crystal oscillator having a small frequency deviation is generally used for the local oscillator circuit of the receiver. Since the frequency deviation of the crystal oscillator hardly exceeds 100 ppm at worst, it is possible to improve the frequency precision of the receiver by using the crystal oscillator for the local oscillator circuit in the receiver.

However, since it is very difficult to directly oscillate a high frequency of 300 MHz band as described above, a method for lowering the oscillation frequency of the crystal oscillator itself to multiply frequency by a frequency multiplier circuit to obtain a frequency of 300 MHz band is generally used.

There is proposed a technique using, as a conventional oscillator circuit, a quintupler circuit 20 for oscillating a crystal oscillator at 65.14 MHz to generate higher harmonics by distorting its waveform and extracting fifth-order higher harmonics by means of a filter or the like to obtain a frequency of 325.7 MHz when a local oscillation frequency of, e.g., 325.7 MHz (=315+10.7 MHz) is intended to be generated.

In this quintupler circuit 20, it is required to increase distortion to generate higher-order higher harmonics in order to increase the multiple number. Although the level of higher harmonic components decreases as the order thereof increases, the higher harmonic components include many undesired components other than originally required fifth-order higher harmonics.

Now, assuming that a rectangular wave of an even function is used as a distorted wave and assuming that it has "1"

in an interval of from (−x) to (+x) and "−1" in other intervals, the following expression can be expressed:

$$A(x-\pi/2)+A\sin x \cdot \cos \omega t + A/2 \sin 2x \cdot \cos 2\omega t + A/3 \cdot \sin 3x \cdot \cos 3\omega t + \ldots + A/n \cdot \sin nx \cdot \cos \omega t \quad (1)$$

wherein A is a constant, ω is an angular frequency which is $2\pi f_{LO}$, t is time, n is a natural number, and the first term is a dc component.

In expression (1), for example, assuming that n=5, the fifth-order higher harmonic components attenuate to ⅕ as large as a fundamental wave. Assuming that x=π/2, the odd orders of expression (1) remain, and the dc component is zero only in this case.

In order to utilize only the fifth-order higher harmonic components, first through fourth order components and sixth or higher order components must be removed. Therefore, only the fifth-order higher harmonic components are extracted by a filter using the quintupler circuit 20. However, undesired higher harmonic components remain at a high level. The undesired higher harmonic components are not only propagated in a space, but the frequencies are also close to each other, so that it is require to use an SAW filter or the like.

If the undesired higher harmonic components come into the mixer 15 via the space and a transmission line, the higher harmonics themselves function as jamming waves. In addition, all of radio waves having a frequency fo' wherein the difference between the frequency $f_{LO'}$, and the frequency fo' of undesired radio waves coming from the outside is equal to an intermediate frequency of 10.7 MHz function as harmful radio waves.

If the receiver is influenced by the harmful radio waves, the keyless entry system may not normally operate, so that it is required to decrease the influence of undesired higher harmonics.

For example, in order to decrease the influence of higher harmonics in the prior art, it is required to take measures to provide a shielding for the frequency multiplier circuit or to spatially increase the distance between the frequency multiplier circuit and the mixer.

Since it is required to prevent the multiple number from increasing in order to reduce the higher harmonics, there is a limit to the multiple number, so that there is a problem in that the oscillation frequency can not be so low. If the source oscillation frequency is high, it is difficult to design the circuit, and the circuit is complicated. In addition, the cost of providing the crystal oscillator is also high.

In order to lower the source oscillation frequency, it is considered to use a phase locked loop (PLL) circuit. However, if the PLL circuit is used, it is required to use an oscillator circuit and a voltage control oscillator (VCO) circuit for obtaining a phase-comparison frequency. In addition, the circuit scale increases, and the costs increases by the PLL circuit and the voltage control oscillator circuit.

Because of this, it is considered that the PLL circuit and the voltage control oscillator circuit are included in one chip to form as an IC and to suppress the increase of the circuit scale and costs. However, if the voltage control oscillator circuit is included in the chip, the C/N ratio deteriorates, so that performance such as sensitivity deteriorates. In order to prevent this, the voltage control oscillator circuit must be provided outside, so that it is not possible to reduce the circuit scale when performance is regarded as important.

In order to combine the PLL circuit with the voltage control oscillator circuit, higher harmonics called phase-comparison spurious occurs, so that it is required to take measures to remove the higher harmonics.

Thus, the conventional oscillator circuit is designed to oscillate at a low frequency using the crystal oscillator in order to improve the frequency precision of the receiver and to quintuple the oscillation frequency of the crystal oscillator by the frequency multiplier circuit, and is provided with a shielding or the like in order to decrease generated undesired higher harmonic components. Therefore, there is a limit to the miniaturization of the circuit, and there is a problem in that it is required to take measures to remove jamming waves.

SUMMARY OF THE INVENTION

It is therefore an object of the present invention to eliminate the aforementioned problems and to provide a frequency multiplier circuit and semiconductor integrated circuit capable of surely removing undesired frequency components with a simple circuit construction.

In order to accomplish the aforementioned and other objects, according to one aspect of the present invention, a frequency multiplier circuit comprises: a source oscillator configured to generate a source oscillator signal using a crystal oscillator; and n frequency multiplier circuits (n is an integer which is 2 or more), each of which includes a 90° phase shifter circuit configured to shift the phase of an input signal by 90°, and a mixer configured to generate a doubled signal of the input signal on the basis of the input signal and an output signal of the 90° phase shifter circuit, wherein the n frequency multiplier circuits are cascade-connected, the source oscillation signal being inputted to a first stage frequency multiplier circuit of the n frequency multiplier circuits, and a final stage frequency multiplier circuit of the n frequency multiplier circuits outputting a signal having a frequency $2^n$ times as high as the frequency of the source oscillation signal.

According to another aspect of the present invention, a semiconductor integrated circuit comprises: a local oscillator circuit configured to generate a local oscillation signal; an intermediate frequency signal converter configured to convert a high frequency signal, which is received by an antenna, into an intermediate frequency signal on the basis of the local oscillation signal; and a demodulator configured to carry out a demodulation processing on the basis of the intermediate frequency signal, wherein the local oscillator circuit comprises: a source oscillator configured to generate a source oscillation signal using a crystal oscillator; and n frequency multiplier circuits, each of which includes a 90° phase shifter circuit configured to shift the phase of an input signal by 90°, and a mixer configured to output a doubled signal of the input signal on the basis of the input signal and an output signal of the 90° phase shifter circuit, the n frequency multiplier circuits being cascade-connected, and the source oscillation signal being inputted to a first stage frequency multiplier circuit of the n frequency multiplier circuits.

According to the present invention, since the n frequency multiplier circuits are cascade-connected to supply the source oscillation signal from the crystal oscillator to the first stage frequency multiplier circuit, it is possible to output a sufficiently high frequency signal from the final stage frequency multiplier circuit even if the source oscillation frequency is low. Therefore, it is possible to easily design the source oscillator, and it is possible to stabilize the characteristics of the source oscillation signal.

In addition, since the frequency multiplier circuit comprises the 90° phase shifter circuit and the mixer, it is possible to realize a frequency multiplier circuit which can efficiently suppress undesired frequency components and which is resistant to jamming. It is also possible to obtain a sufficiently high frequency signal by adjusting the number of stages of connected frequency multiplier circuits.

If the frequency multiplier circuit is provided with a filter circuit, it is possible to surely remove undesired high frequency components. If a variable impedance element is provided in the filter circuit, it is possible to control the frequency characteristics of the filter circuit in accordance with the phase shift quantity of the phase shifter circuit.

If both of the filter circuit and the phase shifter circuit are provided with a limiter amplifier, it is possible to prevent the frequency characteristics of the filter circuit and the cut-off frequency of the phase shifter circuit from depending on the input signal level.

If an impedance element is connected to the variable resistor of the filter circuit in series, it is possible to cancel the fixed phase shift quantity caused by the limiter amplifier of the phase shifter circuit, and it is possible to control the frequency characteristics of the filter circuit so as to faithfully follow the variation in source oscillation frequency.

If the frequency multiplier circuit according to the present invention is used for forming a superheterodyne receiver, portions other than the crystal oscillator and the antenna are provided in one chip, so that it is possible to miniaturize the receiver and reduce costs.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a block diagram of the first preferred embodiment of a receiver including a frequency multiplier circuit according to the present invention;

FIG. 2 is a graph showing a general characteristic of a bifilter circuit;

FIG. 7 is a circuit diagram showing the detailed construction of a filter circuit;

FIG. 8 is a small-signal equivalent circuit diagram of the filter circuit of FIG. 7;

FIG. 9 is a graph expressed by expression (5);

FIG. 11 is a circuit diagram of a filter circuit for use in an actual LSI or the like;

DESCRIPTION OF THE PREFERRED EMBODIMENTS

Referring now to the accompanying drawings, a frequency multiplier circuit and semiconductor integrated circuit according to the present invention will be described below in detail.

First Preferred Embodiment

FIG. 1 is a block diagram of the first preferred embodiment of a receiver using a frequency multiplier circuit according to the present invention. The receiver of FIG. 1 is included in one chip, except for a source oscillator circuit 1 and an antenna 11. In FIG. 1, the same reference numbers are given to the same elements as those in FIG. 15, and different points will be mainly described below.

Figure 15:
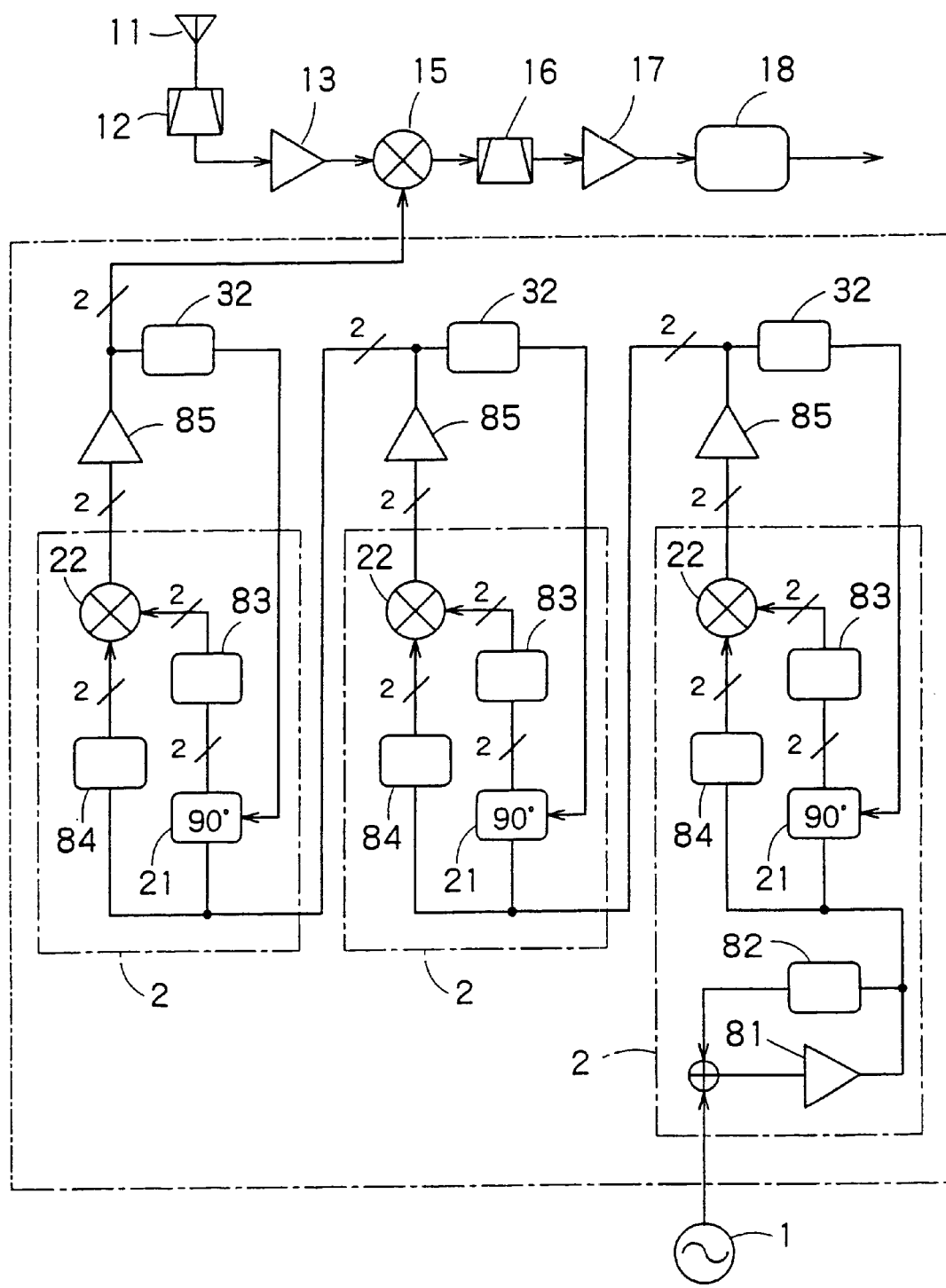
FIG. 15 is a block diagram of the fourth preferred embodiment of a receiver including a frequency multiplier circuit according to the present invention.

The frequency multiplier circuit of FIG. 1 has the same construction as that in FIG. 15, except that the construction of a local oscillator circuit 14a for generating local oscillation signals is different from that in the frequency multiplier circuit of FIG. 15.

The local oscillator circuit 14a of FIG. 1 has a source oscillator circuit 1 for generating source oscillation signals, and a plurality of cascade-connected frequency multiplier circuits 2. In fact, each of the frequency multiplier circuit 2 is a doubler circuit 2 for outputting a signal, the frequency of which is double the frequency of an input signal. This circuit is provided with a 90° phase shifter circuit 2 and a mixer 22.

A source oscillation signal generated by the source oscillator circuit 1 is inputted to the input terminal of the first stage doubler circuit 2, and a local oscillation signal is outputted from the output terminal of the final stage doubler circuit 2. The frequency (local oscillation frequency) $f_{LO}$ of the local oscillation signal is, e.g., 325.7 MHz.

It is considered that an oscillator circuit using, e.g., a crystal oscillator, is used as the local oscillator circuit 1. By using the crystal oscillator, the frequency precision of the local oscillation signal can be improved.

In this preferred embodiment, the three stages of doubler circuits 2 are connected, and a source oscillation signal having a source oscillation frequency of 40.7125 MHz is inputted to the first stage doubler circuit 2. In domestic weak radio wave receiving systems, the local oscillation frequency is often set to be 325.7 MHz with respect to a receiving radio wave having a frequency of 315 MHz.

In this case, the source oscillation frequency is 81.425 MHz when n=2 (quadruple), the source oscillation frequency is 40.7125 MHz when n=3 (octuple), and the source oscillation frequency is 20.35625 MHz when n=4 (16 times).

The source oscillation frequency based on the crystal oscillator has stable characteristics when the frequency is low, and is easily produced. Specifically, the frequency is preferably about 60 MHz or less.

Conversely, if the source oscillation frequency is too low, the source oscillation frequency approaches an intermediate frequency (IF frequency). Therefore, the source oscillation frequency is preferably sufficiently lower 10.7 MHz by setting n=7 or more, or the source oscillation frequency is preferably higher than 10.7 MHz by setting n=less than 4.

However, if n is increased to decrease the source oscillation frequency, the doubler circuit 2 generates undesired frequency components at intervals of the source oscillation frequency, as will be described later, so that it is difficult to remove the undesired frequency components by the filter circuit.

Even if an SAW filter circuit, which is one of filter circuits having the highest removing performance, is used as the filter circuit for removing the undesired frequency components, the following removing level characteristics are required.

Since the general characteristics of the SAW filter circuit are as shown in FIG. 2, required attenuation levels of the undesired frequency components are as follows when attenuation of 85 dB is intended to be obtained as a whole.
Filter Circuit Center Frequency ±20 MHz . . . 65 dB
Filter Circuit Center Frequency ±25 MHz . . . 40 dB
Filter Circuit Center Frequency ±35 MHz . . . 30 dB
Filter Circuit Center Frequency ±40 MHz or more . . . 20 dB Since the undesired frequency components exist at a frequency of a local oscillation frequency fLO ± (Source Oscillation Frequency ×Integer), it is more difficult to remove the undesired frequency components as the source oscillation frequency decreases. Therefore, the source oscillation frequency is preferably higher in view of the removal of higher harmonics using the filter circuit.

Because of this, in domestic weak radio wave receiving systems using 315 MHz band, it can be seen that an octupler circuit (n=3) having a source oscillation frequency of 40 MHz is most preferred. Therefore, in this preferred embodiment, as shown in FIG. 1, the three stages of doubler circuits 2 are cascade-connected, and the source oscillation signal having a frequency of 40.7125 MHz is inputted to the first stage doubler circuit 2.

The 90° phase shifter circuit 21 in the doubler circuit 2 is designed to input a signal, which is caused to be orthogonal to the sinusoidal waveform of an input signal, i.e., the phase of which is shifted by 90° from the phase of an input signal, to the mixer 22.

Now, considering a rectangular wave, which is in the most distorted stage, as the input waveform of the mixer, an example of a waveform can be described so as to have "−1" in an interval in which the phase is in the range of from −π to 0 and have "+1" in an interval in which the phase is in the range of from 0 to π. A state in which this waveform is phase-shifted by X using the phase shifter circuit can be described so that the interval in which the phase is in the range of from −π+x to x has "−1" and the interval in which the phase is in the range of from x to π+x has "+1".

However, the signal inputted to the mixer 22 contains higher harmonic components caused by the non-linearity of the circuit element, and the signal waveform is generally distorted by the higher harmonic components.

Now, considering a rectangular wave as the most distorted stage, a waveform having "−1" in an interval in which the phase is in the range of from (−π) to 0 and "+1" in an interval in which the phase is in the range of from 0 to π is considered as an example of a waveform.

If this waveform is phase-shifted by x using the phase shifter circuit, a waveform is obtained wherein the interval in which the phase is in the range of from (−π+x) to x has "−1" and the interval in which the phase is in the range of from x to (π+x) has "+1" are obtained.

If the two waveforms are multiplied by the mixer 22, the multiplied waveform has "−1" in an interval of from (−π) to (−π+x), "+1" in an interval of from (−π+x) to 0, "−1" in an interval of from 0 to (+x), and "+1" in an interval of from (+x) to π, so that the period of the waveform is halved.

If the two waveforms are described by series of an even function, the following expression (2) is obtained:

$$B(\pi/2-x)+C\cdot\sin(\pi-x)\cdot\cos 2\omega t+C/2\cdot\sin 2(\pi-x)\cdot\cos 4\omega t+C/3\cdot\sin 3(\pi-x)\cdot\cos 6\omega t+\ldots+C/n\cdot\sin n(\pi-x)\cdot\cos 2n\omega t \quad (2)$$

wherein B and C are constants and n is an integer. According to this expression, a higher harmonic 2n times as large as a fundamental wave is obtained. A condition where the quantity of higher harmonic components is minimum is x=π/2. In this case, expression (2) is expressed by expression (3).

$$C\cdot\sin(\pi-x)\cdot\cos 2\omega t+C/3\cdot\sin 3(\pi-x)\cdot\cos 6\omega t+\ldots = C\cdot\cos 2\omega t - C/3\cdot\cos 6\omega t + C/5\cdot\cos 10\omega t - \ldots$$

As can be seen from expression (3), second, sixth, tenth, . . . , (4n−2)-th orders remain, and fourth, eighth, twelfth, . . . , 4n-th orders are removed.

In expression (3), the level of the secondary higher harmonic is highest, and the level decreases as the order of the higher harmonic increases. In addition, a six times high harmonic is adjacent to a double high harmonic.

For example, assuming that the source oscillation frequency is 40.7125 MHz, the frequencies of waves outputted from the first stage doubler circuit 2 are 81.425 MHz, 244.275 MHz, 407.125 MHz, . . . . However, an adjacent frequency of 244.275 MHz is sufficiently spaced from a desired frequency of 81.425 MHz, so that it is possible to relatively easily remove undesired higher harmonic components.

Assuming that n=3, the source oscillation frequency is 40.7125 MHz, and the output frequencies of the respective doubler circuits 2 are as follows.
First Stage: 81.425 MHz, 244.275 MHz, 407.12 MHz, . . .
Second Stage: 162.85 MHz, 488.55 MHz, 814.25 MHz, . . . (caused by 81.425 MHz)
   488.55 MHz, 1465.65 MHz, 2442.75 MHz, . . . (caused by 244.275 MHz)
   814.25 MHz, 2442.75 MHz, 4071.25 MHz, . . . (caused by 407.125 MHz)
Third Stage: 325.7 MHz, 977.1 MHz, 1628.5 MHz, . . . (caused by 162.85 MHz)
   977.1 MHz, 2931.3 MHz, 4885.5 MHz, . . . (caused by 488.55 MHz)
   1628.5 MHz, 4885.5 MHz, 8142.5 MHz, . . . (caused by 814.25 MHz)

The frequency of a signal caused by 244.275 MHz which is a frequency of adjacent undesired higher harmonic components included in the output of the first stage doubler circuit 2 is 488.55 MHz in the output of the second stage, and 977.1 MHz in the output of the third stage. Both are sufficiently spaced from 300 MHz band, so that there is not a bad influence of the higher harmonic components such as a noise.

On the other hand, when the shift of the frequency by the phase shifter circuit is not 90°, the number of undesired higher harmonics is not only doubled, but the adjacent frequency is 162.85 MHz. This appears to be 325.7 MHz in the output of the second stage, and 651.4 MHz in the output of the third stage. Because of this, it is difficult to remove the undesired higher harmonic components, and the required frequency level is decreased by the item of sin (π−x) in expression (2), so that the efficiency of the local oscillator circuit 14a is bad. Therefore, the phase shift quantity using the phase shifter circuit is most preferably 90°.

In view of the foregoing, in this preferred embodiment, the frequency multiplier circuit 2 is formed by the doubler circuit 2 comprising the mixer 22 and the 90° phase shifter circuit 21 to inhibit undesired higher harmonics from being generated, and the multistage doubler circuits 2 are connected to enhance the multiple number of the source oscillation frequency. Specifically, when n stages of doubler circuits 2 are connected, the frequency of the local oscillation signal outputted from the final stage doubler circuit 2 is $2^n \times f$ wherein f is a source oscillation frequency.

In conventional weak radio wave receivers, the multiple number of the local oscillator circuit 14a is limited to about 5, whereas in this preferred embodiment, the multiple number is $2^3=8$ when n=3 and $2^4=16$ when n=4, so that the source oscillation frequency can be decreased by the increase of the multiple number.

For example, the source oscillation frequency is (315+ 10.7)/8=40.7125 MHz when n=3, and (315+10.7)/16= 20.35625 MHz when n=4, so that the source oscillation frequency can be more decreased than the source oscillation frequency of 65.14 MHz which is conventionally used for quintupling the frequency.

Thus, since the oscillation frequency of the crystal oscillator can be decreased, it is possible to easily design the receiver,so that it is possible to reduce the costs. In addition, if the doubler circuits 2 are included in an IC, the higher harmonic component signals generated between the stages of the doubler circuits 2 do not leak to the outside.

Thus, in the first preferred embodiment, the three stages of cascade-connected doubler circuits 2 are provided in the local oscillator circuit 14a to supply a source oscillation signal of the crystal oscillator to the first stage doubler circuit 2 to produce an octupled local oscillator signal, so that it is possible to generate a local oscillation signal having a sufficiently high frequency even if the source oscillation frequency is low.

According to this preferred embodiment, since the oscillation frequency of the crystal oscillator can be set low, the receiver can be easily designed, and the whole receiver can be easily included in a single semiconductor chip except for the antenna 11, so that undesired higher harmonic components are not radiated to the outside.

Second Preferred Embodiment

When the phase shift based on the phase shifter circuit is not 90° in the first preferred embodiment, the input waveform of the mixer includes dc components. Considering a rectangular wave as a distorted wave, and if the rectangular wave including the dc components are multiplied by the mixer as the input waveform, the frequency component of the rectangular wave of the input signal appears in the output of the frequency multiplier circuit in addition to expression (2). Considering a rectangular wave of an even function which is "1" in an interval of from −X to +X and "−1" in other intervals, the rectangular wave can be described by the following expression:

$$A(x - \pi/2) + A\sin x \cdot \cos \omega t + A/2 \cdot \sin 2x \cdot \cos 2\omega t + \quad (4)$$
$$A/3 \cdot \sin 3x \cdot \cos 3\omega t + \ldots + A/n \cdot \sin nx \cdot \cos n\omega t$$

wherein A is a constant, ω is an angular frequency of $2\pi f_{LO}$, t is time, n is a natural number, and the first term denotes a dc component. For example, assuming that n=2 and the source oscillation frequency f0, the frequencies outputted from the respective stages of frequency multiplier circuits are as follows by expressions (1) and (3).

First Stage: f0, 2*f0, 3*f0, 4*f0, . . .
Second Stage: f0, 2*f0, 3*f0, 4*f0, 5*f0, . . . (caused by f0)
 2*f0, 2*2*f0, 3*2*f0, 4*2*f0,* . . . (caused by 2*f0)
 3*f0, 2*3*f0, 3*3*f0, 4*3*f0, . . . (caused by 3*f0)
 4*f0, 2*4*f0, 3*4*f0, 4*4*f0, . . . (caused by 4*f0)

Adjacent undesired higher harmonics f0 and 3*f0 from the output of the first stage become 3*f0 and 5*f0 in the output of the second stage. The difference from a required frequency 4*f0 is only to, so that it is difficult to remove this.

The adjacent undesired frequencies are caused by phase noises. Assuming that ω is an angular velocity and t is time, the phase Φ is expressed as follows.

$$\Phi = \omega * t \quad (5)$$

Assuming that the phase noise before passing through the second stage doubler circuit is dΦ1, the phase noise is expressed as follows by expression (5).

$$d\Phi 1 = \omega * dt$$

Since the time difference dt which is the source of the phase noise does not vary before and after passing the frequency multiplier circuit, dΦ2=2*ω*dt=2*dΦ1 is obtained by expression (5) assuming that the phase noise after passing through the second stage frequency multiplier circuit is dΦ2. By this expression, the phase noise dΦ2 after passing through the second stage frequency multiplier circuit is twice as large as the phase noise dΦ1 before passing through the second stage frequency multiplier circuit.

This means that the signal level of adjacent undesired frequencies after passing through the second stage frequency multiplier circuit is twice as high as the signal level before passing through the second stage frequency multiplier circuit. That is, assuming that the signal level of a required frequency is 0 dB, the signal level of adjacent undesired frequencies is increased by 6 dB every time passing through one stage frequency multiplier circuit.

Thus, in the first preferred embodiment, the undesired frequencies are generated in the vicinity of the required frequency, and the signal level of the adjacent undesired frequencies is increased by 6 dB every time passing through one stage doubler circuit. Therefore, the required frequency is easily interfered by the undesired frequencies, and the receiving sensitivity may deteriorate, so that communication quality may deteriorate.

In the second preferred embodiment, a filter circuit is provided between stages of doubler circuits 2 to more reduce higher harmonic noises.

Figure 3:
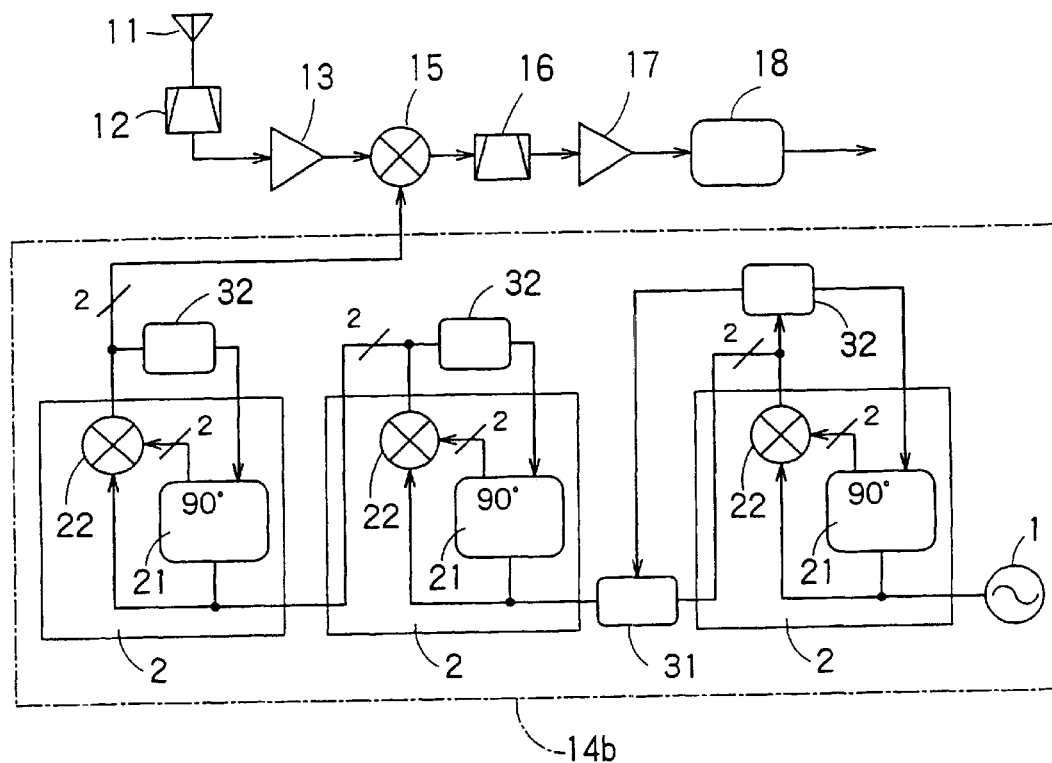
FIG. 3 is a block diagram of the second preferred embodiment of a receiver including a frequency multiplier circuit according to the present invention.

FIG. 3 is a block diagram of the second preferred embodiment of a receiver including a frequency multiplier circuit according to the present invention. The receiver of FIG. 3 can also be included in a single semiconductor chip except for the antenna 11. In FIG. 3, the same reference numbers are given to the same elements as those in FIG. 1, and different points will be mainly described below.

The receiver of FIG. 3 has the same construction as that in FIG. 1, except that the construction of a local oscillator circuit 14b is different. The local oscillator circuit 14b of FIG. 3 comprises: n stages of doubler circuits 2 connected to a source frequency multiplier circuit 1; a filter circuit 31 connected to the output terminal of the first stage doubler circuit 2; and a plurality of phase shift adjusting circuits 32 for adjusting the phase shift quantity of a 90° phase shifter circuit 21 in each of the doubler circuits 2.

When a dc error component ΔV exists in an input signal of a mixer 22, the input signal also leaks to an output signal. For example, if a signal having an effective value of 100 mV has a dc error of 1 mV, a leakage of 20 log (1 mV/100 mV)=−40 dB occurs in the output.

The filter circuit 31 is designed to remove the undesired higher harmonic components included in the output signal of the first stage doubler circuit 2, and the leakage of the input signal of the mixer 22. Each of the phase shift adjusting circuits 32 is designed to adjust the phase shift quantity of the 90° phase shifter circuit 21 so that the dc component of the output of the mixer 22 in the corresponding doubler circuits 2 is zero.

The first stage phase shift adjuster is designed to supply a signal in proportion to a control signal of the corresponding 90° phase shifter circuit to the filter circuit 31 to control the frequency characteristics of the filter circuit 31.

While FIG. 3 has shown an example where the phase shift adjustment of the 90° phase shifter circuit and the control of the frequency characteristics of the filter circuit 31 are carried out on the basis of the output of the mixer 22 in each of the doubler circuits 2, the phase shift quantity of the phase shifter circuit and the frequency characteristics of the filter circuit 31 may be controlled on the basis of a signal other than the output of the mixer 22.

While the filter circuit 31 has been connected only to the output terminal of the first stage doubler circuit 2 in FIG. 3, the filter circuit 31 may also be connected to the output terminal of the second and subsequent stages of doubler circuits 2. In this case, if the filter circuit 31 is connected to the output terminal of the doubler circuit 2 nearer to the first stage, it is possible to more efficiently remove undesired higher harmonic components.

In the second preferred embodiment, it is premised that the phase shift quantity of the 90° phase shifter circuit 21 in the doubler circuit 2 is always 90°. However, in an actual circuit, the phase shift quantity of the 90° phase shifter circuit 21 is not always 90° due to the variation in element and temperature conditions.

Assuming that the phase shift quantity of the phase shifter circuit is x, the dc component of the output of the mixer 22 is B(π/2−x) by expression (2).

Although the dc component of the output of the mixer 22 is zero when x=π2, it is not zero when x is not π/2, a 4n order undesired higher harmonic component appears, and the originally required secondary high harmonic level is lowered by the term sin(π−x) in expression (2).

That is, if x=π/2, sin(π−x)=1, so that the term sin(π−x) in expression (2) is maximum, and if x is shifted from π/2, this term is lowered. Therefore, the fact that the dc component exists in the output of the mixer 22 shows the state that the originally required secondary higher harmonic level is lowered and the 4n order undesired higher harmonic component appears.

Because of this, if the phase shift quantity of the 90° phase shifter circuit 21 is adjusted so that sin(π−1)=1 in expression (2), the dc component of the output of the mixer 22 can be zero.

Figure 4:
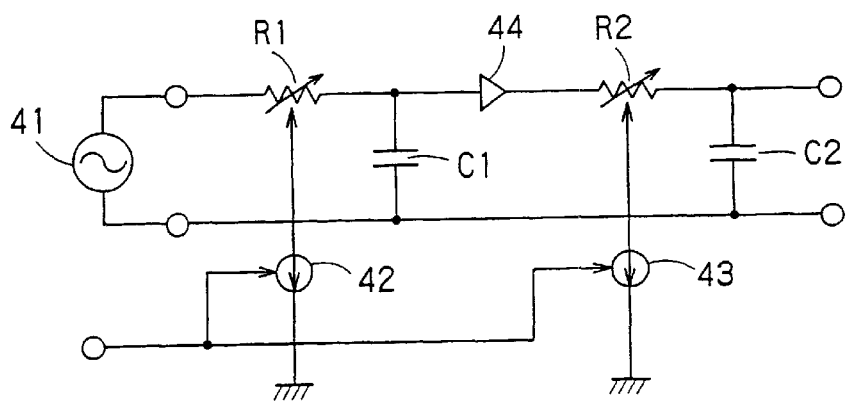
FIG. 4 is a circuit diagram showing an example of a 90° phase shifter circuit using a semiconductor element.

A CR phase shifter circuit using, e.g., the semiconductor element shown in FIG. 4, is considered as the 90° phase shifter circuit 21 capable of adjusting the phase shift quantity. The CR phase shifter circuit of FIG. 4 comprises: a reference oscillator 41; a variable resistor R1, the resistance value of which is variably controlled by the quantity of current flowing through a current source 42; a variable resistor R2, the resistance value of which is variably controlled by the quantity of current flowing through a current source 43; capacitors C1 and C2; and an amplifier 44. The reference oscillator 41 corresponds to the output of the previous stage doubler circuit 4.

The variable resistors R1 and R2 are resistors utilizing the p-n junction of semiconductors. Assuming that a current flowing through the p-n junction is I, the value R of resistance of the variable resistors R1 and R2 is expressed by expression (6).

$$R = V_T / I \qquad (6)$$

In expression (6), R can be varied by varying the current I, so that the phase shift quantity can be varied.

In expression (6), $V_T$ is expressed by $V_T=kT/q$ wherein k is Boltzmann's constant, T is an absolute temperature and q is the quantity of charges of electrons, and $V_T$ is about 26 mV at ordinary temperatures. The current quantity I can be set by a current source. If the current quantity I of the current source is controlled by the dc component of the output of the mixer 22, the phase shift quantity can be controlled so that the dc component of the output of the mixer 22 is always zero.

That is, the CR phase shifter circuit of FIG. 4 can control the value of resistance of the variable resistors by adjusting the current quantity I of the current source. By controlling this value of resistance, the dc component of the output of the mixer 22 can be changed.

In order to decrease errors in the phase shift quantity, the dc gain of the phase shift adjusting circuit 32 is set to be sufficiently large, and the current quantity I of the current source is changed in accordance with the change of the dc component. That is, assuming that a dc error is ΔV and the dc gain of the control circuit is A, the error decreases as A increases since ΔV is in proportion to I/A.

By the above described control, the 90° phase shifter circuit 21 can be controlled so that the dc component of the output of the mixer 22 is always 0, and the phase shift quantity of the 90° phase shifter circuit 21 can be always held to be 90°. When the phase shift in the 90° phase shifter circuit 21 is held to be correctly 90°, the output frequencies of the respective stages of the doubler circuits 2 are as follows.

First Stage: 81.425 MHz, 244.275 MHz, 407.125 MHz, . . .
Second Stage: 162.85 MHz, 488.55 MHz, 814.25 MHz, . . . (caused by 81.425 MHz)

488.55 MHz, 1465.65 MHz, 2442.75 MHz, . . . (caused by 244.275 MHz)

814.25 MHz, 2442.75 MHz, 4071.25 MHz, . . . (caused by 407.125 MHz)

Third Stage: 325.7 MHz, 977.1 MHz, 1628.5 MHz, . . . (caused by 162.85 MHz)

977.1 MHz, 2931.3 MHz, 4885.5 MHz, . . . (caused by 488.55 MHz)

1628.5 MHz, 4885.5 MHz, 8142.5 MHz, . . . (caused by 814.25 MHz)

Since the undesired higher harmonic components outputted from the third stage doubler circuit 2 have frequencies of 977.1 MHz or more which are sufficiently separated, it seems that only a desired frequency of 325.7 MHz can be easily obtained even if the filter circuit 31 is not used.

However, as described above, the 4n order higher harmonic component appears when the phase shift quantity is not held to be 90°. In fact, various frequency components act on the mixer 22 of the doubler circuit 2. In this case, the output frequencies of the respective stages of doubler circuits are as follows.

First Stage: 81.425 MHz, 162.85 MHz, 244.275 MHz, 325.7 MHz, 407.125 MHz, . . .
Second Stage: 162.85MHz, 325.7MHz, 488.55MHz, 651.4MHz, 814.25 MHz, . . . (caused by 81.425 MHz)
   325.7 MHz, 651.4 MHz, 977.1 MHz, 1302.8 MHz, 1628.5 MHz, . . . (caused by 162.85 MHz)
   488.55 MHz, 977.1 MHz, 1465.65 MHz, 1954.2 MHz, . . . (caused by 244.275 MHz)
   651.4 MHz, 1302.8 MHz, 1954.2 MHz, 2605.6 MHz, 3257 MHz, . . . (caused by 325.7 MHz)
   814.25 MHz, 1628.5 MHz, 2442.75 MHz, 3257 MHz, . . . (caused by 407.125 MHz)
   81.425 MHz, 162.85 MHz, 244.275 MHz, 325.7 MHz, . . .
   (interaction between higher harmonics in the first stage)
Third Stage: 325.7 MHz, 651.4 MHz, 977.1 MHz, 1302.8 MHz, 1628.5 MHz, . . . (caused by 162.85 MHz)
   488.55 MHz, 977.1 MHz, 1465.65 MHz, 1954.2 MHz, . . . (caused by 244.275 MHz)
   651.4 MHz, 1302.8 MHz, 1954.2 MHz, 2605.6 MHz, 3257 MHz, . . . (caused by 325.7 MHz)
   814.25 MHz, 1628.5 MHz, 2442.75 MHz, 3257 MHz, . . . (caused by 407.125 MHz)
   977.1MHz, 1954.2MHz, 2931.3MHz, 3908.4MHz, 4885.5 MHz, . . . (caused by 488.55 MHz)
   81.425 MHz, 162.85 MHz, 244.275 MHz, 325.7 MHz, . . .
   (interaction between higher harmonics in the second stage)

Thus, frequency components which are multiples of 81.425 MHz remain in the output of the third stage which is the final stage. That is, frequencies adjacent to the finally required frequency of 325.7 MHz are 244.275 MHz and 407.125 MHz, and the difference therebetween is only 81.425 MHz, so that it is difficult to remove these frequencies.

The reason for this is that the frequency components which are multiples of 81.425 MHz are left in the output of the first stage. For example, if a filter circuit 31 for transmitting only a frequency of 81.425 MHz is provided in the output of the first stage to remove other frequency components, the output frequency of the respective stages are as follows.

First Stage: 81.425 MHz
Second Stage: 162.85MHz, 325.7MHz, 488.55MHz, 651.4MHz, 814.25 MHz, . . .
Third Stage: 325.7 MHz, 651.4 MHz, 977.1 MHz, 1302.8 MHz, 1628.5 MHz, . . . (caused by 162.85 MHz)
   651.4 MHz, 1302.8 MHz, 1954.2 MHz, 2605.6 MHz, 3257 MHz, . . . (caused by 325.7 MHz)
   814.25 MHz, 1628.5 MHz, 2442.75 MHz, 3257 MHz, . . . (caused by 407.125 MHz)
   977.1 MHz, 1954.2 MHz, 2931.3 MHz, 3908.4 MHz, 4885.5 MHz, . . . (caused by 488.55 MHz)
   162.85 MHz, 325.7 MHz, 488.55 MHz, 651.4 MHz, . . .
   (interaction between higher harmonics in the second stage)

Thus, the frequency component of multiple number of 81.425 MHz remains to the third stage output, which is the last stage. That is, the frequencies adjacent to the frequency of 325.7 MHz necessary finally are 244.275 MHz and 407.125 MHz. Because the difference between these frequencies is only 81.425 MHz, it is difficult to remove these frequency components.

The reason why the frequency difference becomes 81.425 MHz is because the frequency component of multiple number of 81.425 MHz is included to the output of the first stage. For example, when the filter circuit 31 for passing only 81.425 MHz is connected to the output of the first stage to remove the other frequency components, the output frequency of the respective stages are as follows.

First Stage: 81.425 MHz
Second Stage: 162.85 MHz, 325.7MHz, 488.55MHz, 651.4MHz, 814.25 MHz, . . . (caused by 81.425 MHz)
Third Stage: 325.7 MHz, 651.4 MHz, 977.1 MHz, 1302.8 MHz, 1628.5 MHz, . . . (caused by 162.85 MHz)
   651.4 MHz, 1302.8 MHz, 1954.2 MHz, 2605.6 MHz, 3257 MHz, . . . (caused by 325.7 MHz)
   814.25 MHz, 1628.5 MHz, 2442.75 MHz, 3257 MHz, . . . (caused by 407.125 MHz)
   977.1 MHz, 1954.2 MHz, 2931.3 MHz, 3908.4 MHz, 4885.5 MHz, . . . (caused by 488.55 MHz)
   162.85 MHz, 325.7 MHz, 488.55 MHz, 651.4 MHz, . . .
   (interaction between higher harmonics in the second stage)

Thus, the filter circuit 31 is connected to the output terminal of the first stage doubler circuit 2, frequencies adjacent to 325 MHz are 162.85 MHz and 488.55 MHz, and the difference therebetween is 162.85 MHz, so that it is easy to remove these frequencies.

If the filter circuit 31 for transmitting only a frequency of 162.85 MHz is also provided in the output of the second stage doubler circuit 2, the output frequency of the respective stages are as follows.

First Stage: 81.425 MHz
Second Stage: 162.85 MHz
Third Stage: 325.7 MHz, 651.4 MHz, 977.1 MHz, 1302.8 MHz, 1628.5 MHz, . . . (caused by 162.85 MHz)

Thus, the undesired higher harmonic components outputted from the third stage are greatly removed, and the frequency adjacent to 325 MHz is 651.4 MHz, so that the undesired higher harmonic components can be sufficiently removed.

The above described filter circuit 31 has a low-pass or band-pass construction for removing higher harmonics, and must be capable of optionally controlling frequency characteristics in accordance with the variation in source oscillation frequency.

For example, the variation in source oscillation frequency means a case where a system is intended to be used at a frequency which varies due to the difference in system to be used, and a case where the source oscillation frequency slightly varies due to variation of elements, temperature characteristics and so forth.

Figure 5:
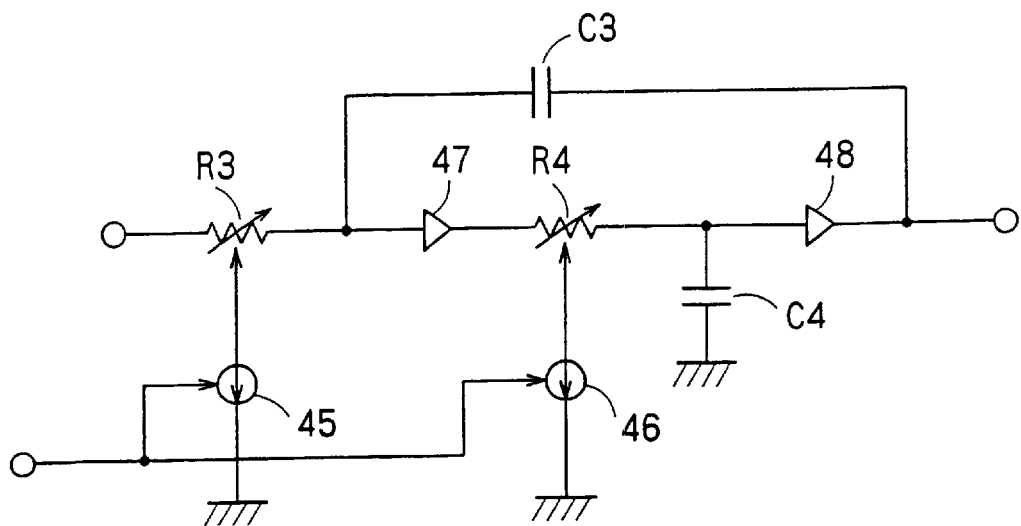
FIG. 5 is a circuit diagram showing an example of a filter circuit.

In order to realize such a filter circuit 31, there is considered a filter circuit shown in, e.g., FIG. 5. The filter circuit 31 of FIG. 5 is a secondary low-pass filter circuit which comprises: a variable resistor R3, the resistance value of which is variably controlled by the quantity of current flowing through a current source 45; a variable resistor R4, the resistance value of which is variably controlled by the quantity of current flowing through a current source 46; amplifiers 47 and 48; and capacitors C3 and C4.

In FIG. 5, the dc component of the output of the mixer 22 of the first stage doubler circuit 2 is supplied to the current source. If the current quantity of the current source varies in accordance with the change of the dc component of the output of the mixer 22, resistance value of the resistor 30 can be varied. This is based on the same concept as that of the resistors R1 and R2 of the CR phase shifter circuit shown in FIG. 4.

In the second preferred embodiment, the dc component of the output of the mixer 22 is controlled so that the phase shift quantity based on the CR phase shifter circuit shown in FIG. 4 is actually 90°. That is, this means that the value of resistance of the CR phase shifter circuit settles in such a value that the phase shift quantity is 90° even if the source oscillation frequency is varied.

If the filter circuit 31 comprises the resistors R3 and R4 which have the same constructions as those of the resistors R1 and R2 which are used for the CR phase shifter circuit of FIG. 4 and if the filter circuit 31 is controlled by control signals of the CR phase shifter circuit, the value of resistance settles in the value of resistance capable of always shifting the phase of the source oscillation frequency by 90°. Therefore, if this value is inversely operated to set the capacity of the capacitor so as to decide the frequency characteristics of the filter circuit 31, it is possible to form the filter circuit 31 following the variation in source oscillation frequency.

Thus, in the second preferred embodiment, the phase shift adjusting circuit 32 is provided for monitoring the output of the mixer 22, and the displacement of the phase shift can be corrected by controlling the phase shift quantity of the 90° phase shifter circuit so that the dc component is always zero. Therefore, even if the phase shift quantity is shifted from 90° due to the variation in element and temperature change, the phase shift quantity can be immediately adjusted, so that the dc component of the output of the mixer 22 can be always zero.

In addition, since the filter circuit 31 is provided between the stages of the doubler circuits 2, it is possible to surely inhibit the occurrence of undesired higher harmonics, so that higher harmonic noises are not radiated to the outside of the IC including the receiver in this preferred embodiment. Therefore, it is not required to provide shielding for the frequency multiplier circuit unlike conventional devices, and it is not required to spatially insure the distance between the frequency multiplier circuit and the mixer 22, so that it is possible to easily design the circuit and to miniaturize the circuit.

Third Preferred Embodiment

In the third preferred embodiment of a frequency multiplier circuit according to the present invention, the constructions of a 90° phase shifter circuit 21 and a filter circuit 31 are different from those in the second preferred embodiment.

Figure 6:
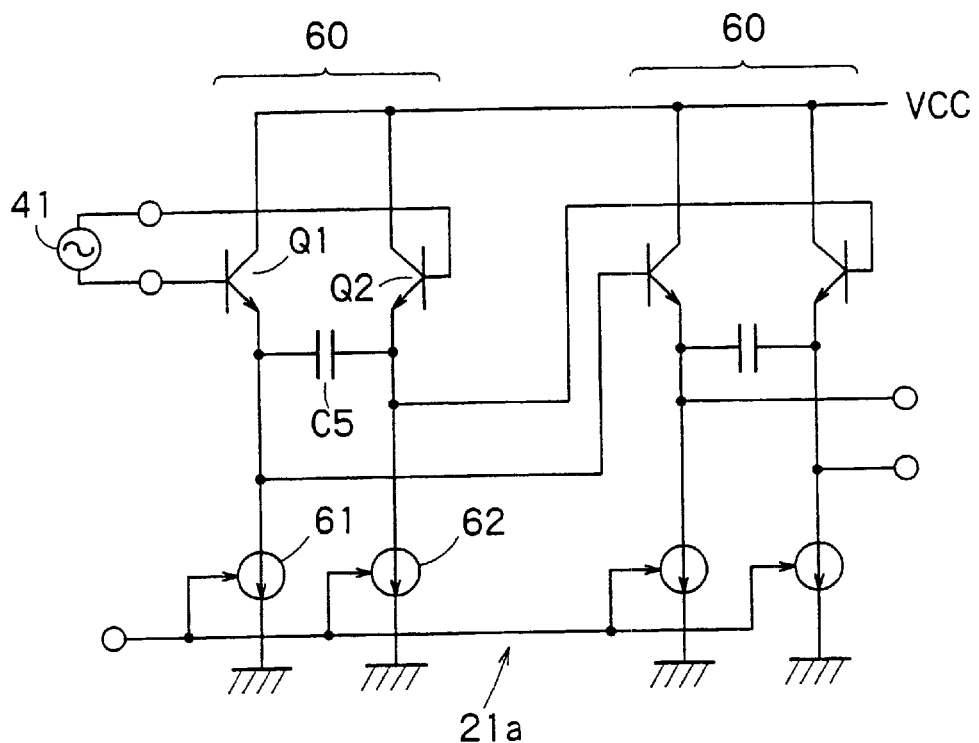
FIG. 6 is a circuit diagram showing the detailed construction of the third preferred embodiment of a 90° phase shifter circuit according to the present invention.

FIG. 6 is a circuit diagram showing the detailed construction of the third preferred embodiment of a 90° phase shifter circuit 21a according to the present invention. The 90° phase shifter circuit 21a of FIG. 6 is a CR phase shifter circuit using a semiconductor element (transistor). In the 90° phase shifter circuit 21a, two stages of 45° phase shifting parts (first and second phase shifting parts) 60 for shifting a phase by 45° are cascade-connected to each other.

The 45° phase shifting parts 60 of FIG. 6 comprises: transistors Q1 and Q2, to the base terminal of which the output of a reference oscillator 41 is supplied; a capacitor C5 which is provided between the emitter terminals of the transistors Q1 and Q2; and current sources 61 and 62 which are connected to the emitter terminals of the transistors Q1 and Q2, respectively. The current supplied from the current sources 61 and 62 is controlled by the phase shift adjusting circuit 32 of FIG. 3.

The resistance R of the p-n junction between the base and emitter of the transistors Q1 and Q2 viewed from the emitter side is R=VT/I assuming that the current flowing through the p-n junction is I, so that the resistance R can be varied by varying I. That is, the frequency characteristics can be varied by controlling the current flowing through the transistors Q1 and Q2. Furthermore, VT is expressed by VT=kT/q wherein k is Boltzmann's constant, T is an absolute temperature and q is the quantity of charges of electrons, and VT is about 26 mV at ordinary temperatures.

The current I flowing through the transistors Q1 and Q2 is determined by the current supplied from the current sources 61 and 62. If the current quantity of the current sources 61 and 62 is controlled by the dc component of the output of the mixer 22 of FIG. 3, the phase shift quantity can be adjusted so that the dc component of the output of the mixer 22 is always 0.

In the circuit of FIG. 6, the emitter resistance of the transistors Q1 and Q2 is adjusted by the current quantity of the current sources 61 and 62, and the current quantity of the current sources 61 and 62 is varied in accordance with the change of the dc component of the output of the mixer 22. Specifically, the current quantity of the current sources 61 and 62 is varied so that the dc component of the output of the mixer 22 decreases. Thus, the 90° phase shifter circuit 21a can be controlled so that the dc component of the output of the mixer 22 is always 0, so that the phase shift quantity can be maintained to be 90°

However, in an actual circuit, the phase shift quantity is not always 90° due to the variation in element and temperature conditions, and various frequency components act on the mixer of the doubler circuit 2. Because of this, the filter circuit 31 of FIG. 3 has to be constituted of a low-pass or band-pass construction for removing higher harmonics, and must be capable of optionally controlling frequency characteristics in accordance with the variation in source oscillation frequency.

For example, the variation in source oscillation frequency means a case of intending to use the frequency different in accordance with the used system different from each other, and a case where the source oscillation frequency slightly varies due to the variation in elements, temperature characteristics and so forth.

As a filter circuit 31 meeting such requirements, a circuit shown in FIG. 7 is considered. The filter circuit 31 of FIG. 7 comprises: transistors (first and second variable impedance elements) Q3 and Q4 capable of varying a base-to-emitter resistance; capacitors (first capacitor elements) C6 and C7 which are provided between output terminals OUT1 and OUT2; a transistor (first transistor) Q5 for controlling the voltage of the output terminal OUT1 in accordance with a base-to-emitter current of the transistor Q4; a transistor (second transistor) Q6 for controlling the voltage of the output terminal OUT2 in accordance with a base-to-emitter current of the transistor Q3; a current source 63 which is connected between the emitter and ground terminal of the transistor Q5; a current source 64 which is connected between the emitter and ground terminal of the transistor Q6; and capacitors (second capacitor elements) C8 and C9 which are connected to the emitters of the transistors Q5 and Q6.

Between the output terminals OUT1 and OUT2 and between the emitters of the transistors Q5 and Q6, the two capacitors (C6, C7) and the two capacitors (C8, C9) are connected in series, respectively. These capacitors are provided so as to be consistent to the small-signal equivalent circuit diagram of FIG. 8 which will be described later, and the number of the capacitors may be one.

The current passing through the current sources 63 and 64 is controlled by the output dc component of the mixer 22 in the doubler circuit 2 of FIG. 3. By changing the current passing through the current sources 63 and 64, it is possible to change the emitter resistor of the transistors Q3, Q4, Q5 and Q6. This is the same conception as the resistor of the above CR phase shifter circuit.

It has been described above that the dc component of the output of the mixer 22 in the double circuit 2 is controlled so that the phase shift quantity based on the CR phase shifter circuit is 90°. That is, this means that the value of resistance of the CR phase shifter circuit always settles in such a value of resistance that the quantity can be phase-shifted by 90° even if the source oscillation frequency is varied on various conditions.

If the filter circuit 31 comprises an emitter resistor which has the same construction as that of the emitter resistor of the transistor in the CR phase shifter circuit and if the filter circuit 31 is controlled by control signals of the CR phase shifter circuit, the value of resistance settles in the emitter resistance capable of always shifting the phase of the source oscillation frequency by 90°. Therefore, if this value is inversely operated to set the capacity of the capacitor so as to decide the frequency characteristics of the filter circuit 31, it is possible to form the filter circuit 31 following the variation in source oscillation frequency.

FIG. 8 is a small-signal equivalent circuit diagram of the filter circuit 31 of FIG. 7. That is, FIG. 8 shows a laterally symmetric circuit wherein the capacitors C6 =C7, C8=C9 and the current source 63=64 in the filter circuit 31 of FIG. 7.

In FIG. 8, the emitter resistors of the transistors Q3, Q4 and transistors Q5, Q6 are expressed by variable resistors (first and second variable impedance elements) re, and the transistors Q5, Q6 are expressed by a buffer 81. Since the base and collector of the transistors Q5, Q6 are crossed, the same current as the output current Io of the buffer 81 flows through a constant current source (current supply circuit) 82. Moreover, the capacitors C6, C7 of FIG. 7 are expressed by a capacitor (first capacitor element) C11, and the capacitors C8, C9 are expressed by a capacitor C12.

The transfer function T(s) of the small-signal equivalent circuit of FIG. 8 is described as expression (7):

$$T(s)=(1+s \times C12 \times re)/(1-(\omega \times re)^2 \times C11 \times C12 + s \times (C11 \times re + C12 \times re - C12 \times re) \quad (7)$$

FIG. 9 is a graph expressed by expression (7), wherein the axis of abscissas denotes frequency (standardized at the central frequency) and the axis of ordinates denotes amplitude (expressed by logarithm). In the small-signal equivalent circuit diagram of FIG. 8, Q is determined by the ratio C11/C12 of the capacitance C11 to the capacitance C12, and Q is high when the value of C11/C12 is small.

FIG. 9 shows characteristics in the cases of C11/C12=0.44 and C11/C12=0.25. By setting Q to be an appropriate value, the quantity of attenuation of adjacent undesired frequencies can be adjusted.

Figure 10:
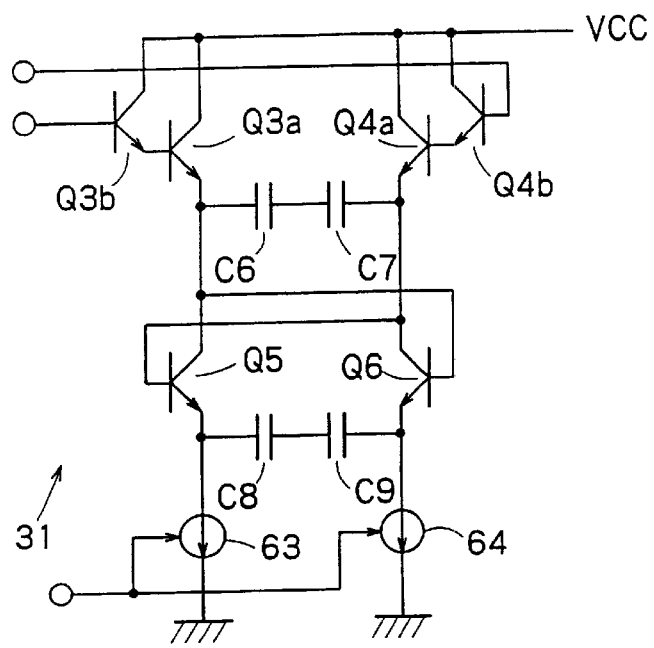
FIG. 10 is a circuit diagram of a filter circuit wherein transistors Q3 and Q4 of FIG. 7 are Darlington-connected.

FIG. 10 shows a filter circuit 31 wherein the transistors Q3 and Q4 of FIG. 7 are Darlington-connected. The resistance of the input side viewed from the emitters of the transistors Q3 and Q4 is 2×re, and a linearly operation range is ±2VT (about ±52 mV) in differential.

Figure 11:
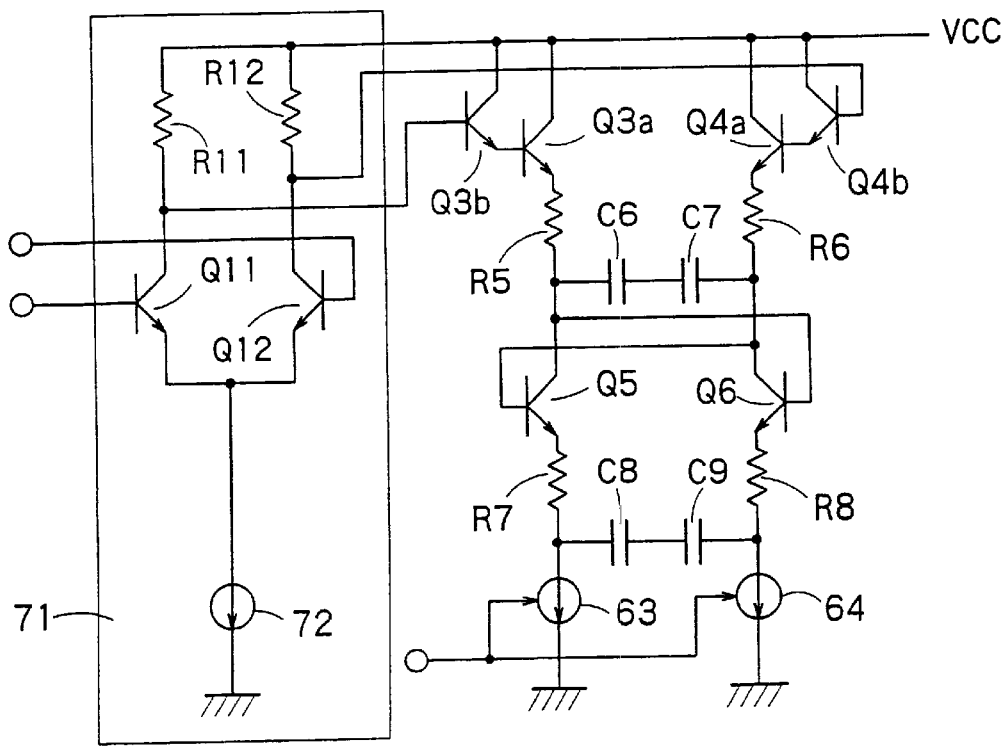

FIG. 11 shows a filter circuit 31 used for an actual LSI or the like. The dc voltage error generated by the filter circuit 31 of FIG. 11 is usually about 1 mV, and the required signal level must be sufficiently higher than the dc error voltage. The filter circuit 31 of FIG. 11 is characterized in that a limiter amplifier (first limiter amplifier) 71 is provided between the input terminal and transistors Q3, Q4 of FIG. 7.

In the filter circuit 31 of FIG. 11, a linearly operating range is ±2 VT (about +52 mV), and is not sufficiently greater than the dc error voltage 1 mV. Therefore, in order to obtain an operating range which is sufficiently greater than the dc error voltage, it is required to operate the filter circuit 31 in a non-linear range. Since the dc error voltage should be 1% or less, the input signal level should be usually 100 mV. However, when the filter circuit 31 is operated in a non-linear range, the frequency characteristics of the filter circuit 31 are varied by the input signal level, so that the limiter amplifier 71 of FIG. 11 is required.

The frequency characteristics of the filter circuit 31 of FIG. 11 must be controlled in accordance with the phase shift quantity of the 90° phase shifter circuit 21a. However, when there is a fixed phase shift quantity based on a limiter amplifier 26 provided in the 90° phase shifter circuit 21a, the frequency characteristics of the filter circuit 31 are shifted by a value corresponding to the fixed phase shift quantity. This means that the frequency characteristics of the filter circuit 31 can not faithfully follow the phase shift quantity of the 90° phase shifter circuit 21a if the source oscillation frequency varies, so that required signals are attenuated.

Therefore, in order to cancel the fixed phase shift quantity caused by the limiter amplifier 26, the filter circuit 31 of FIG. 11 is provided with a fixed resistor (first impedance element) R5 between the emitter of the transistor Q3 and the collector of the transistor Q5, a fixed resistor (second impedance element) R6 between the emitter of the transistor Q4 and the collector of the transistor Q6, a fixed resistor (third impedance element ) R7 between the emitter of the transistor Q5 and the current source 63, and a fixed resistor (fourth impedance element) R8 between the emitter of the transistor Q6 and the resistor R8. Thus, the fixed phase shift quantity caused by the limiter amplifier 26 is canceled, so that it is possible to realize the filter circuit 31 faithfully following the phase shift quantity of the 90° phase shifter circuit.

The values of resistance of the fixed resistors R7 and R8 are obtained as follows. Assuming that the fixed phase shift quantity of the 90° phase shifter circuit 21a (two 45° phase shifter circuits) is α and the variable phase shift quantity is β(α+β=45°) in a certain frequency, the value R of resistance of the fixed resistors R5 through R8 is obtained by expression (6):

$$R:re=\alpha:\beta \quad (8)$$

wherein re and β are variable and controlled in inverse proportion to a constant current I. If expression (8) is transformed, expression (9) is obtained.

$$R=(\alpha/\beta) \times re \quad (9)$$

The fixed resistors R5 and R6 are expressed by an expression wherein 2re is substituted for re in expression (9).

If the limiter amplifier 71 of FIG. 11 is provided in the filter circuit 31, the linearly operating range is ±2VT (about ±52 mV) which is not sufficiently greater than the dc error voltage of 1 mv. Therefore, in order to obtain a sufficiently greater operating range than the dc error voltage, it is required to operate the filter circuit 31 in a non-linear range. Since the dc error voltage should be 1% or less, the input signal level should be usually 100 mV. However, when the filter circuit 31 is operated in the non-linear range, it is required to provide the limiter amplifier 71 since the frequency characteristics of the filter circuit 31 is varied by the input signal level.

Figure 12:
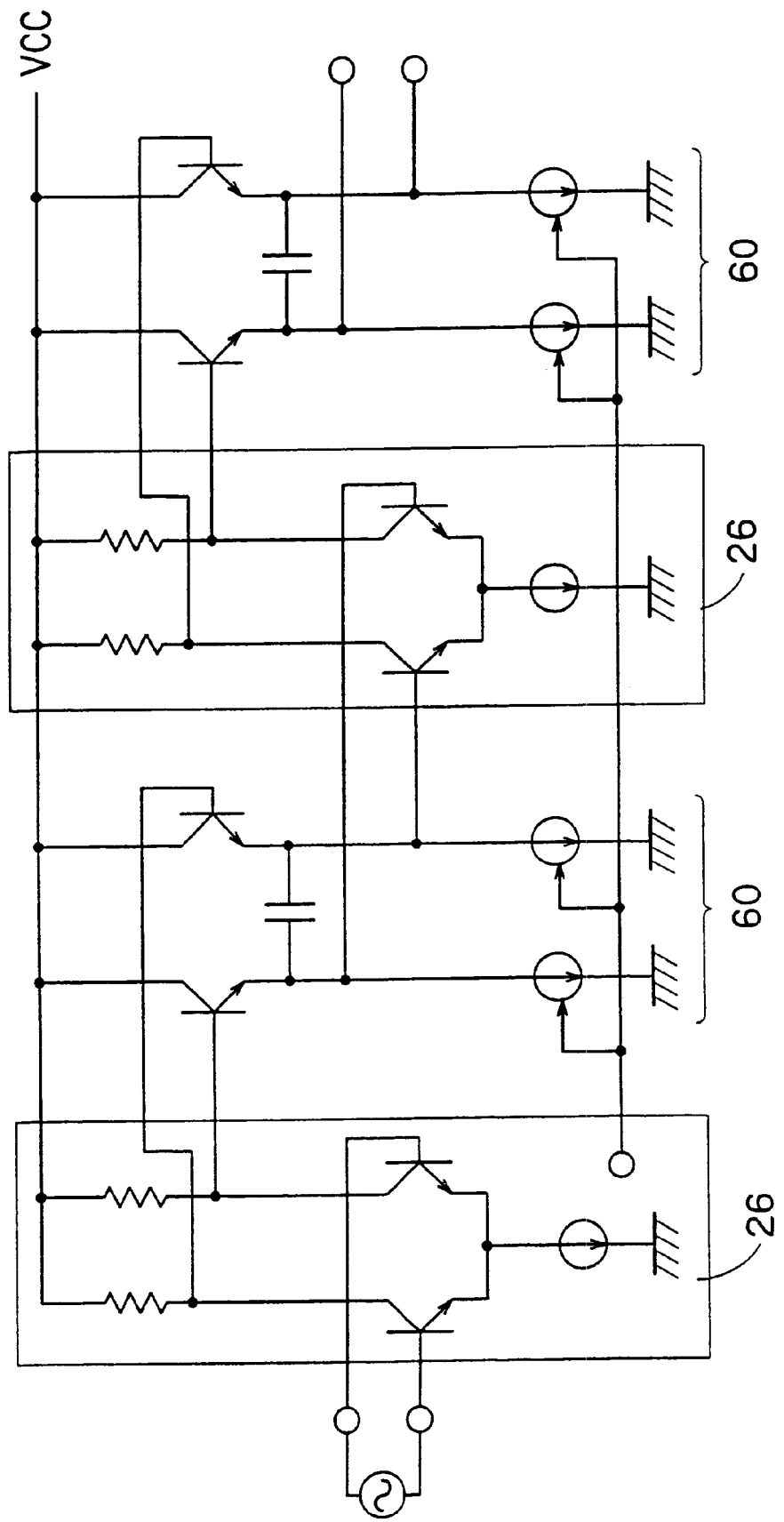
FIG. 12 is a circuit diagram of a 90° phase shifter circuit having a limiter amplifier.

FIG. 12 is a circuit diagram of a 90° phase shifter circuit 21a having a limiter amplifier 26. By this circuit, it is possible to obtain a sufficiently great input signal level with respect to the dc voltage error.

Thus, in this preferred embodiment, in order to cancel the fixed phase shift quantity, which is caused by the limiter amplifier 26 of the 90° phase shifter 21a, by the resistors R6 through R8 provided in the filter circuit 31, it is possible to realize the filter circuit 31 capable of controlling the frequency characteristics faithfully following the phase shift quantity of the 90° phase shifter circuit 21a. Thus, even if adjacent undesired high frequencies are generated, the filter circuit 31 can attenuate undesired frequencies.

Figure 13:
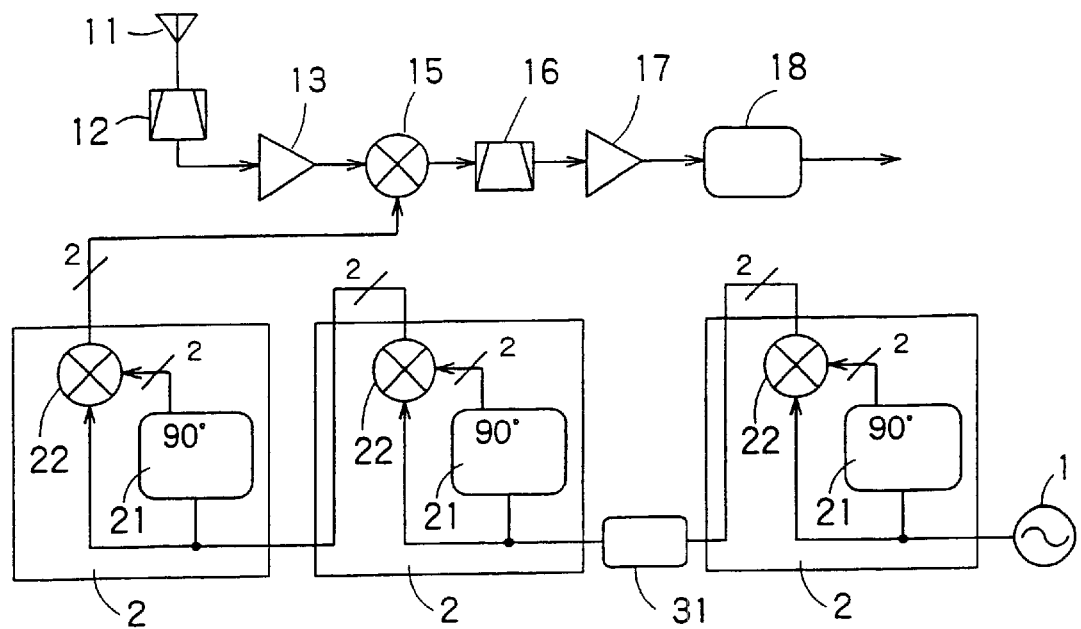
FIG. 13 is a circuit diagram showing an example of a local oscillator circuit having a filter circuit and no phase shift adjusting circuit.
Figure 14:
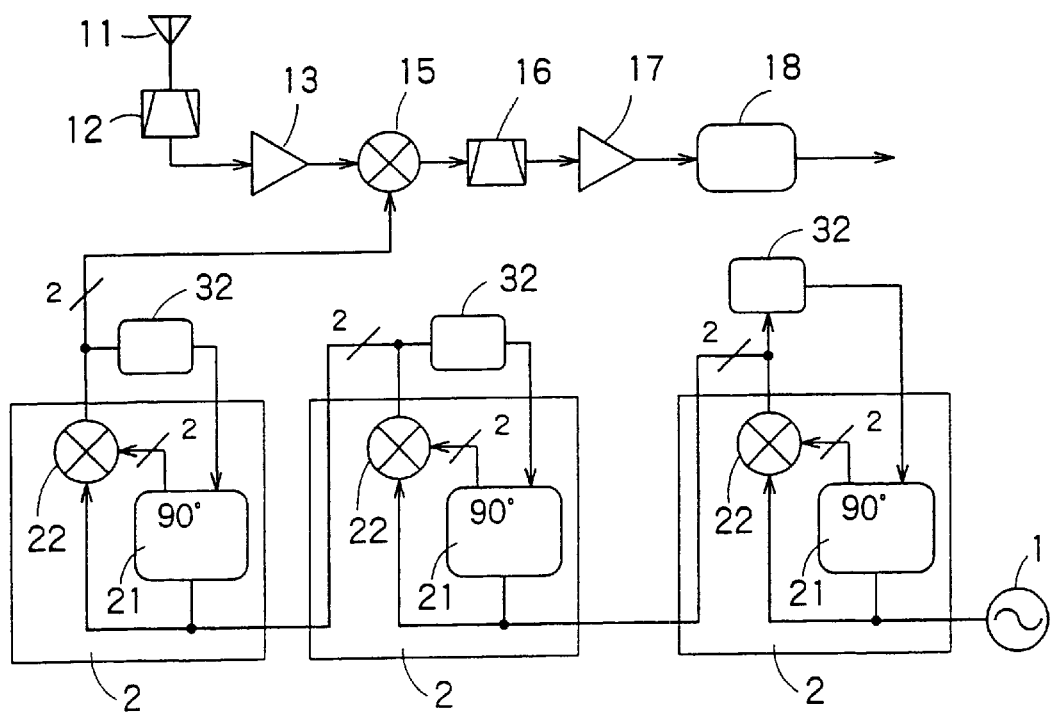
FIG. 14 is a circuit diagram showing an example of a local oscillator circuit having a phase shift adjusting circuit and no filter circuit.

While FIG. 3 has shown the local oscillator circuit 14b having both of the filter circuit 31 and the phase shift adjusting circuit 32, a local oscillator circuit 14b having a filter circuit 31 and no phase shift adjusting circuit 32 as shown in FIG. 13, and a local oscillator circuit 14b having a phase shift adjusting circuit 32 and no filter circuit 31 as shown in FIG. 14 are considered.

In the case of the construction of FIG. 13, undesired higher harmonic components can be removed by the filter circuit 31 although the phase shift quantity of the 90° phase shifter circuit 21a can not be adjusted. In the case of the construction of FIG. 14, the phase shift quantity of the 90° phase shifter 21a can be adjusted although higher harmonic components can not be removed by the filter circuit 31. In either case, the circuit construction can be more simplified than that in FIG. 3.

Fourth Preferred Embodiment

As described in the second preferred embodiment, undesired frequency components appear if the phase shift quantity in the 90° phase shifter circuit 21 is not correctly held to be 90°. The signal level of the undesired frequency components is doubled every time passing through the doubler circuit 2.

That is, assuming that the signal level of a required frequency is 0 dB, the signal level of adjacent undesired frequencies is increased by 6 dB every time passing through one stage doubler circuit 2. Because of this, the required frequency is easily interfered by the undesired frequencies, and the receiving sensitivity deteriorates, so that communication quality deteriorates. Therefore, it is difficult to realize commercialization of products.

The cause of the occurrence of undesired frequency components from the doubler circuits 2 will be described below. The mixer 22 has two input terminals. If signals f1 and f2 are inputted to these input terminals, the mixer 22 outputs a frequency signal of |f1±f2|. If the signals f1 and f2 contain even order distorted components 2n·f (n is an integer which is 0 or more), the mixer 22 outputs a frequency signal of (2n·f) ±f=(2n±1)·f. Therefore, the frequency component of (2n+1)·f remains in the output of the doubler circuit 2.

If the phase difference between input signals of the mixer 22 is shifted from 90°, a frequency component of 4·f remains in the output signal of the mixer 22. If the output of the mixer 22 is inputted directly to the phase shift adjusting circuit as shown in FIG. 3, the phase shift adjusting circuit itself generates a DC offset by the frequency component of 4·f included in the output signal of the mixer 22, so that it is difficult to remove the DC offset.

For example, if the output signal of the mixer 22 contains a frequency component of 2·f and a frequency component of 4·f, a dc component is generated by a tertiary intermodulation as expressed by expression (10).

$$4 \cdot f - 2 \cdot f \times 2 = 0 \text{ (DC)} \quad (10)$$

Thus, the phase shift can not be maintained to be correctly 90°, and the frequency component of 4·f contained in the output of the mixer 22 can not be removed.

Also, if two input signals to the mixer 22 contain higher harmonic components other than the above described components, frequency components which are the sum of and difference between these frequency components are generated in the mixer 22 to be spurious. If this spurious is generated in the first stage doubler circuit 2, undesired frequency components are increased by 6 dB in the respective stages of doubler circuits 2. However, the construction of FIG. 3 can not remove such undesired frequency components.

The fourth preferred embodiment which will be described later is characterized in that spurious contained in the source oscillation signal from the source oscillator circuit 1 is removed, and the distorted component contained in the input signal of the mixer 22 is removed, and the distorted component contained in the output signal of the mixer 22 is removed.

FIG. 15 is a block diagram of the fourth preferred embodiment of a receiver including a frequency multiplier circuit according to the present invention. The receiver of FIG. 15 has the same construction as that in FIG. 3, except that the internal construction of the doubler circuit in the local oscillator circuit 14 is different from that in FIG. 3.

While three stages of doubler circuits 2 are connected in FIG. 15, the number of stages of doubler circuits 2 to be connected is not particularly limited.

Figure 16:
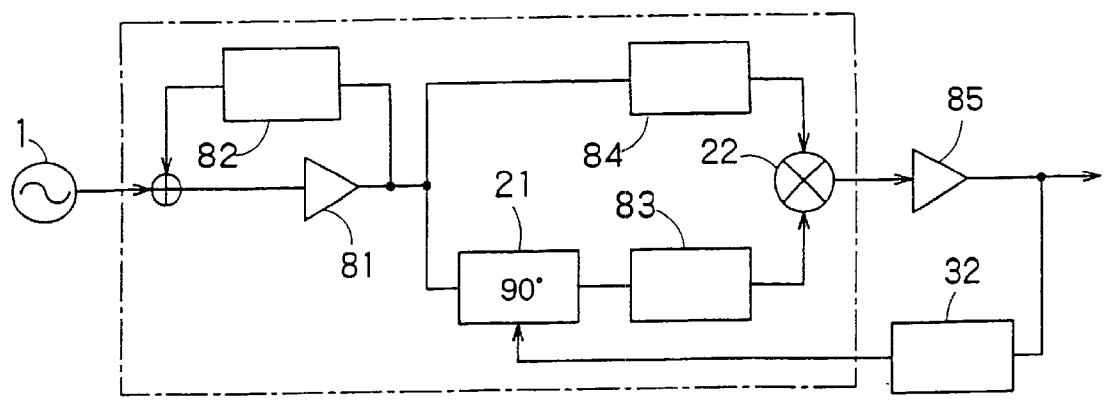
FIG. 16 is an enlarged block diagram of an internal construction of a doubler circuit 2 at the first stage.

Among the three stages of doubler circuits 2 of FIG. 15, only the construction of the first stage doubler circuit 2 is different. FIG. 16 is an enlarged block diagram of the internal construction of the first stage doubler circuit 2. As shown in FIG. 16, the first stage doubler circuit 2 comprises: a limiter amplifier (first waveform shaping circuit) 81 for shaping the waveform of a source oscillation signal from the source oscillation circuit 1; an offset cancel circuit 82 for removing a DC offset, which is contained in the output of the limiter amplifier 81, to feed the output back to the input side of the limiter amplifier 81; a 90° phase shifter circuit 21 for shifting the phase of the output signal of the limiter amplifier 81 by 90°; a limiter amplifier (fourth waveform shaping circuit) 83 for shaping the waveform of the output of the 90° phase shifter circuit 21; a limiter amplifier (third waveform shaping circuit) 84 for shaping the waveform of the output of the limiter amplifier 81; and a mixer 22 for generating a doubled signal on the basis of the output signals of the limiter amplifiers 83 and 84. After the output of the mixer 22 is inputted to the limiter amplifier (second waveform shaping circuit) 85 to be waveform-shaped to be inputted to the phase shift adjusting circuit 32 to remove a DC offset therefrom.

The doubler circuits 2 other than the first stage in FIG. 15 have a construction wherein the limiter amplifier 81 and the offset cancel circuit 82 are omitted from the first stage doubler circuit.

The limiter amplifier 81 is designed to remove the even order distorted components contained in the source oscillation signal from the source oscillator circuit 1, and the offset cancel circuit 82 is designed to remove the DC offset contained in the output of the limiter amplifier 81. Thus, a complete rectangular wave having a duty ratio of 50% is inputted to the 90° phase shifter circuit 21.

Since the above described construction of FIG. 3 can not remove the even order frequency components contained in the source oscillation signal from the source oscillator circuit 1, there is the possibility that odd order ((2n+1)×f) spurious of multiplied output may be generated in the output of the mixer 22. However, since the construction of FIG. 15 is designed to carry out a multiplication processing after changing the source oscillation signal to a complete rectangular wave having a duty ratio of 50%, spurious is not generated in the output of the mixer 22.

Figure 17:
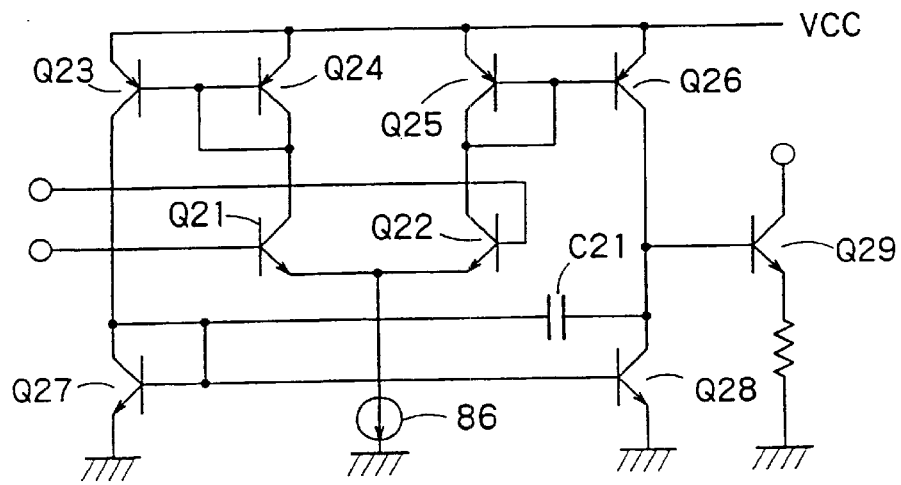
FIG. 17 is a circuit diagram showing the detailed construction of an offset cancel circuit 82 of FIG. 16.

FIG. 17 is a circuit diagram showing the detailed construction of the phase shift adjusting circuit of FIG. 16. The offset cancel circuit 82 of FIG. 17 comprises: a differential amplifier having transistors Q21 and Q22 for comparing offset voltages of differential input signals, and a current source 86; a current mirror circuit having transistors (Q23, Q24), (Q25, Q26), (Q27, Q28) connected to the differential amplifier; a capacitor C21 for removing ac components from the output of the differential amplifier; and a transistor Q29 for current-outputting the output of the differential amplifier. The capacitor C21 and the transistor Q28 constitute a low-pass filter.

Figure 18:
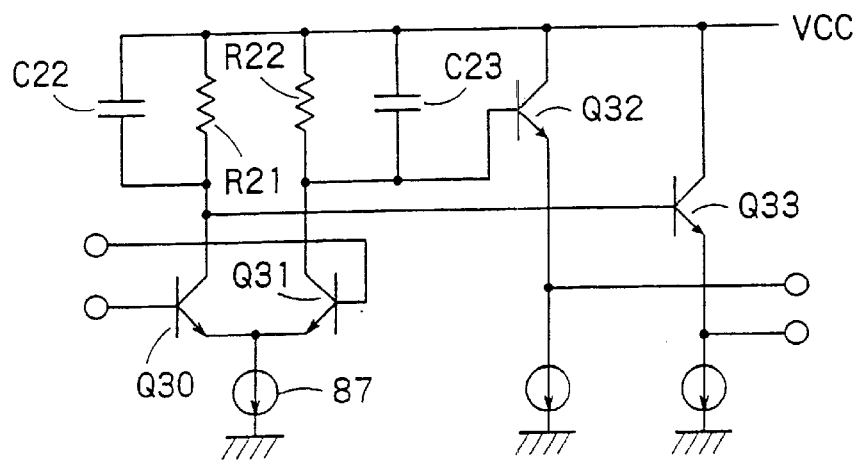
FIG. 18 is a circuit diagram showing the detailed construction of a limiter amplifier of FIG. 16.
Figure 19:
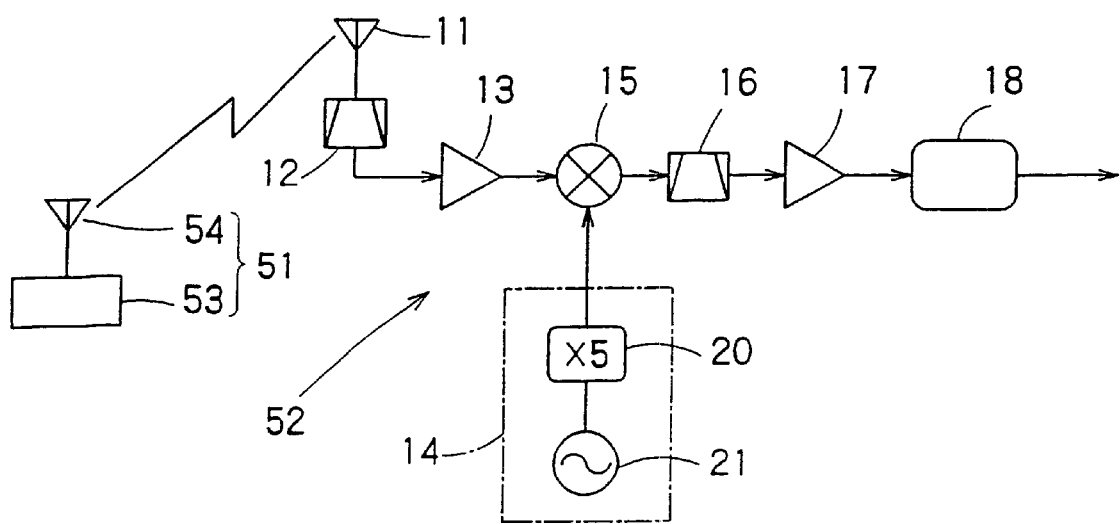
FIG. 19 is a block diagram showing the schematic construction of a conventional weak radio wave sending/receiving system.

FIG. 18 is a circuit diagram showing the detailed construction of the limiter amplifier of FIG. 16. The limiter amplifier of FIG. 18 comprises: a differential amplifier having transistors Q30 and Q31, resistors R21 and R22 and a current source 87; capacitors C22 and C23 connected to the resistors R21 and R22 in parallel, respectively; and an emitter follower circuit having transistors Q32 and Q33 connected to the output of the differential amplifier. The capacitors C22 and C23 and the resistors R21 and R22 constitute a low-pass filter.

The low-pass filters of FIGS. 17 and 18 are not always essential constructions, but it is possible to reduce higher order spurious by providing the low-pass filters.

If the phase shift quantity of the 90° phase shifter circuit 21 is shifted from 90° in the doubler circuit 2 of FIG. 16, a frequency component of 4·f appears in the output of the mixer 22. This frequency component is changed to a DC offset by the limiter amplifier 85, and the DC offset is removed by the phase shift adjusting circuit 32.

If the output of the mixer 22 contains an amplitude distorted component, the distorted component is changed to a DC component by the limiter amplifier 85. Therefore, the distorted component is not inputted to the phase shift adjusting circuit 32, and no tertiary intermodulation is generated.

Thus, even if the signal from the source oscillator circuit 1 contains even order distorted components, if the DC offset contained in the output of the mixer 22 is removed by the limiter amplifier 85, it is possible to obtain a complete rectangular wave having a duty ratio of 50%, so that it is possible to remove even order components (2n×f (n=0, 1, 2, 3, . . . ) of the output. That is, in the construction of FIG. 3, even order components exist in the output signal of the source oscillator circuit 1, and if the components are inputted to the mixer 22, odd order ((2n+1)×f) spurious of multiplied output is generated in the output signal of the source oscillator circuit 1, whereas in the construction of FIG. 15, it is possible to remove surely remove spurious.

If two input signals to the mixer 22 have the same waveform and contain tertiary spurious components, one of the input signals contains frequency components of f(0°) and 3f(0°), and the other input signal contains frequency components of f(90°) and 3f((270°)).

If signals of these frequency components are inputted to the mixer 22, eight kinds of frequency components which are the sum of and difference between the respective frequency components appear. Combinations generated from quadruple frequencies among the eight kinds of frequency components are the following two kinds of frequency components.

$$f(90°) \times 3 \cdot f(0°) \rightarrow 4 \cdot f(90°)$$

$$f(0°) \times 3 \cdot f(270°) \rightarrow 4 \cdot f(270°)$$

Since the phases of the two kinds of signals are different from each other by 180°, these signals are canceled out, so that the frequency component of 4·f disappears.

This means that the frequency component of 4·f can be canceled when two input signals to the mixer 22 have the same waveform, i.e., only when two input signals to the mixer 22 have the same level as that of the phase of the tertiary component. In this preferred embodiment, it is possible to cancel the frequency component of 4·f by previously shaping a signal, which is inputted to the mixer 22, by means of the limiter amplifiers 83 and 84.

There are the following frequency components of 4·f.

$$(5 \cdot f) - f \rightarrow 4 \cdot f$$

$$(7 \cdot f) - (3 \cdot f) \; 4 \cdot f$$

It is difficult to cancel high frequency components such as 5·f and 7·f. Therefore, in this preferred embodiment, low-pass filters are provided in the limiter amplifiers 81 and 83 through 85 for attenuating high order components.

Thus, in this preferred embodiment, the distorted components contained in the input signals of the doubler circuits 2 and the output signals of the 90° phase shifter circuit 21 are changed to DC offsets by the limiter amplifiers 83 and 84 and then inputted to the mixer 22. Therefore, even if the input signals of the mixer 22 contain even order components, it is possible to inhibit the occurrence of odd order ((2n+1)×f) spurious components of multiplied outputs passing though the output of the mixer 22.

In addition, similarly to the filter circuit 31 shown in FIG. 3, a band-pass filter may be provided between the mixer 22 and the limiter amplifier 85 although this is not shown in FIG. 15. Thus, it is possible to remove spurious contained in the output of the mixer 22. Even if spurious is generated in the band-pass filter itself, it is possible to remove the spurious by the subsequent stage limiter amplifier 85 and offset cancel circuit 82.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A frequency multiplier circuit comprising:
   a source oscillator configured to generate a source oscillator signal using a crystal oscillator;
   n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit, said n frequency multiplier circuits being cascade-connected, said source oscillation signal being inputted to a first stage frequency multiplier circuit of said n frequency multiplier circuits, and a final stage frequency multiplier circuit of said n frequency multiplier circuits outputting a signal having a frequency $2^n$ times as high as the frequency of said source oscillation signal; and at least one phase shift adjusting circuit provided so as to correspond to at least part of said n frequency multiplier circuits, said phase shifter circuit adjusting the phase shift quantity of a corresponding one of said 90° phase shifter circuits so that the output dc voltage, of a corresponding one of said mixers is substantially zero, wherein said 90° phase shifter circuit comprises:
  a first current source capable of adjusting a current quantity by the output of said phase shift adjusting circuit; and
  a first impedance element wherein impedance is variably controlled in accordance with a current quantity flowing through said current source.

2. A frequency multiplier circuit as set forth in claim 1, which further comprises at least one filter circuit, provided between adjacent two of at least part of stages of said n frequency multiplier circuits, configured to remove undesired frequency components, wherein said phase shift adjusting circuit configured to adjust a band characteristic of a corresponding one of said filter circuits so that the output dc voltage of a corresponding one of said mixers is zero.

3. A frequency multiplier circuit as set forth in claim 2, wherein said filter circuit comprises:
  a second current source capable of adjusting a current quantity by the output of said phase shift adjusting circuit; and
  a second impedance element wherein impedance is variably controlled in accordance with a current quantity flowing through said current source.

4. A frequency multiplier circuit as set forth in claim 2, wherein said filter circuit comprises:
  a first variable impedance element which is connected between an input terminal and an output terminal and which is capable of varying impedance by currents;
  a first capacitor element connected to said output terminal;
  a second variable impedance element configured to control a voltage of said output terminal in accordance with currents; and
  a current supply circuit configured to pass a current, which has the same phase as that of a current flowing through said second variable impedance element, through said output terminal.

5. A frequency multiplier circuit as set forth in claim 4, wherein said filter circuit further comprises a first limiter amplifier, connected between said first and second input terminals and said first and second variable impedance elements, configured to limit a voltage amplitude of an input signal to a predetermined voltage range to output the limited signal, and said 90° phase shifter circuit comprises:
  first and second phase shifting parts, cascade-connected to each other, configured to shift the phase of input signals by substantially 45° to output the phase-shifted signals;
  a second limiter amplifier, connected to the upstream of said first phase shifting part, configured to limit a voltage amplitude of an input signal to a predetermined voltage to output the limited signal; and
  a third limiter amplifier, connected between said second limiter amplifier and said second phase shifting part, configured to limit a voltage amplitude of an output signal of said first phase shifting part to a predetermined voltage range to output the limited signal.

6. A frequency multiplier circuit as set forth in claim 2, wherein said filter circuit comprises:
  a first variable impedance element which is connected between a first input terminal and a first output terminal and wherein impedance is variably controlled by a current flowing through said first input terminal;
  a second variable impedance element which is connected between a second input terminal and a second output terminal and wherein impedance is variably controlled by a current flowing through said second input terminal;
  a first capacitor element connected between said first and second output terminals;
  a first transistor configured to control a voltage of said first output terminal;
  a second transistor configured to control a voltage of said second output terminal; and
  a second capacitor element connected between the output terminals of each of said first and second transistors,
  wherein said first transistor passes a current, which has the same phase as that of a current flowing through said second transistor, through said first output terminal, and
  said second transistor passes a current, which has the same phase as that of a current flowing through said first transistor, through said second output terminal.

7. A frequency multiplier circuit as set forth in claim 6, wherein said filter circuit comprises:
  a first impedance element connected between said first variable impedance element and said first output terminal;
  a second impedance element connected between said second variable impedance element and said second output terminal;
  a third impedance element connected to said first transistor and said second capacitor element; and
  a fourth impedance element connected between said second transistor and said second capacitor element.

8. A frequency multiplier circuit as set forth in claim 6, wherein at least one of said first through fourth variable impedance elements comprises a bipolar transistor configured to variably control impedance by controlling a current flowing through an emitter terminal of said bipolar transistor.

9. A frequency multiplier circuit as set forth in claim 8, wherein at least one of said first through fourth variable impedance elements comprises a plurality of bipolar transistors which are Darlington-connected.

10. A frequency multiplier circuit as set forth in claim 2, wherein said filter circuit is provided at least between the first and second stages of said frequency multiplier circuits.

11. A frequency multiplier circuit as set forth in claim 1, wherein a first stage frequency multiplier circuit of said n frequency multiplier circuits includes:
  a waveform shaping circuit configured to shape the waveform of said source oscillation signal generated by said source oscillator; and
  an offset cancel circuit configured to remove an output dc component of said first waveform shaping circuit.

12. A frequency multiplier circuit as set forth in claim 11, wherein said first waveform shaping circuit includes a limiter amplifier and a low-pass filter.

13. A frequency multiplier circuit as set forth in claim 1, which further comprises:
at least one waveform shaping circuit and at least one phase shift adjusting circuit which are provided so as to correspond to at least part of frequency multiplier circuits of said n frequency multiplier circuits,
wherein said waveform shaping circuit shapes the waveform of an output signal of said mixer, and
said phase shift adjusting circuit adjusts a phase shift quantity of a corresponding one of said 90° phase shifter circuit.

14. A frequency multiplier circuit as set forth in claim 13, wherein said waveform shaping circuit includes a limiter amplifier and a low-pass filter.

15. A frequency multiplier circuit as set forth in claim 1, which further comprises:
first and second waveform shaping circuits sand a phase shift adjusting circuit which are provided so as to correspond to at least part of frequency multiplier circuits of said n frequency multiplier circuits,
wherein said first waveform shaping circuit shapes the waveform of said input signal,
said second waveform shaping circuit phases an output signal of said 90° phase shifter circuit, and
said mixer generates a doubled signal of said input signal on the basis of each of output signals of said first and second waveform shaping circuits.

16. A frequency multiplier circuit as set forth in claim 15, wherein at least one of said first and second waveform shaping circuits includes a limiter amplifier and a low-pass filter.

17. A semiconductor integrated circuit comprising:
a local oscillator circuit configured to generate a local oscillation signal;
an intermediate frequency signal converter configured to convert a high frequency signal, which is received by an antenna, into an intermediate frequency signal on the basis of said local oscillation signal; and
a demodulator configured to carry out a demodulation processing on the basis of said intermediate frequency signal,
wherein said local oscillator circuit comprises:
a source oscillator configured to generate a source oscillation signal using a crystal oscillator; and
n frequency multiplier circuits, each of which includes a 90° phase shifter circuit configured to shift the phase of an input signal by 90°, and a mixer configured to output a doubled signal of said input signal on the basis of said input signal and an output signal of said 90° phase shifter circuit,
said n frequency multiplier circuits being cascade-connected, and said source oscillation signal being inputted to a first stage frequency multiplier circuit of said n frequency multiplier circuits.

18. A frequency multiplier circuit comprising:
a source oscillator configured to generate a source oscillator signal using a crystal oscillator;
n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit,
wherein said n frequency multiplier circuits are cascade-connected, said source oscillation signal being inputted to a first stage frequency multiplier circuit of said n frequency multiplier circuits, and a final stage frequency multiplier circuit of said n frequency multiplier circuits outputting a signal having a frequency $2^n$ times as high as the frequency of said source oscillation signal;
at least one phase shift adjusting circuit provided so as to correspond to at least part of said n frequency multiplier circuits,
wherein said phase shifter circuit adjusts the phase shift quantity of a corresponding one of said 90° phase shifter circuits so that the output dc voltage of a corresponding one of said mixers is substantially zero, and
wherein said phase shift adjusting circuit configured to adjust a band characteristic of a corresponding one of said filter circuits so that the output dc voltage of a corresponding one of said mixers is zero; and
at least one filter circuit, provided between adjacent two of at least part of stages of said n frequency multiplier circuits, configured to remove undesired frequency components,
wherein said filter circuit comprises:
a second current source capable of adjusting a current quantity by the output of said phase shift adjusting circuit; and
a second impedance element wherein impedance is variably controlled in accordance with a current quantity flowing through said current source.

19. A frequency multiplier circuit comprising:
a source oscillator configured to generate a source oscillator signal using a crystal oscillator;
n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit,
wherein said n frequency multiplier circuits are cascade-connected, said source oscillation signal being inputted to a first stage frequency multiplier circuit of said n frequency multiplier circuits, and a final stage frequency multiplier circuits of said n frequency multiplier circuits outputting a signal having a frequency $2^n$ times as high as the frequency of said source oscillation signal;
at least one filter circuit, provided between adjacent two of at least part of stages of said n frequency multiplier circuits, configured to remove undesired frequency components,
wherein said filter circuit comprises:
a first variable impedance element which is connected between an input terminal and an output terminal and which is capable of varying impedance by currents;
a first capacitor element connected to said output terminal;
a second variable impedance element configured to control a voltage of said output terminal in accordance with currents; and
a current supply circuit configured to pass a current, which has the same phase as that of a current flowing through said second variable impedance element, through said output terminal.

20. A frequency multiplier circuit as set forth in claim 19, wherein said filter circuit further comprises a first limiter amplifier, connected between said first and second input terminals and said first and second variable impedance elements, configured to limit a voltage amplitude of an input signal to a predetermined voltage range to output the limited signal, and said 90° phase shifter circuit comprises:

first and second phase shifting parts, cascade-connected to each other, configured to shift the phase of input signals by substantially 45° to output the phase-shifted signals;

a second limiter amplifier, connected to the upstream of said first phase shifting part, configured to limit a voltage amplitude of an input signal to a predetermined voltage to output the limited signal; and a third limiter amplifier, connected between said second limiter amplifier and said second phase shifting part, configured to limit a voltage amplitude of an output signal of said first phase shifting part to a predetermined voltage range to output the limited signal.

21. A frequency multiplier circuit comprising:

a source oscillator configured to generate a source oscillator signal using a crystal oscillator;

n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit, wherein said n frequency multiplier circuits are cascade-connected, said source oscillation signal being inputted to a first stage frequency multiplier circuit of said n frequency multiplier circuits, and a final stage frequency multiplier circuit of said n frequency multiplier circuits outputting a signal having a frequency $2^n$ times as high as the frequency of said source oscillation signal;

at least one filter circuit, provided between adjacent two of at least part of stages of said n frequency multiplier circuits, configured to remove undesired frequency components, wherein said filter circuit comprises:

a first variable impedance element which is connected between a first input terminal and a first output terminal and wherein impedance is variably controlled by a current flowing through said first input terminal;

a second variable impedance element which is connected between a second input terminal and a second output terminal and wherein impedance is variably controlled by a current flowing through said second input terminal;

a first capacitor element connected between said first and second output terminals;

a first transistor configured to control a voltage of said first output terminal;

a second transistor configured to control a voltage of said second output terminal; and a second capacitor element connected between the output terminals of each of said first and second transistors, wherein said first transistor passes a current, which has the same phase as that of a current flowing through said second transistor, through said first output terminal, and said second transistor passes a current, which has the same phase as that of a current flowing through said first transistor, through said second output terminal.

22. A frequency multiplier circuit as set forth in claim 21, wherein at least one of said first through fourth variable impedance elements comprises a bipolar transistor configured to variably control impedance by controlling a current flowing through an emitter terminal of said bipolar transistor.

23. A frequency multiplier circuit as set forth in claim 22, wherein at least one of said first through fourth variable impedance elements comprises a plurality of bipolar transistors which are Darlington-connected.

24. A frequency multiplier circuit as set forth in claim 21, wherein said filter circuit comprises:

a first impedance element connected between said first variable impedance element and said first output terminal;

a second impedance element connected between said second variable impedance element and said second output terminal;

a third impedance element connected to said first transistor and said second capacitor element; and a fourth impedance element connected between said second transistor and said second capacitor element.

25. A frequency multiplier circuit comprising:

a source oscillator configured to generate a source oscillator signal using a crystal oscillator;

n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit, wherein said n frequency multiplier circuits are cascade-connected, said source oscillation signal being inputted to a first stage frequency multiplier circuit of said n frequency multiplier circuits, and a final stage frequency multiplier circuit of said n frequency multiplier circuits outputting a signal having a frequency $2^n$ times as high as the frequency of said source oscillator signal, wherein a first stage frequency multiplier circuit of said n frequency multiplier circuits includes:

a first waveform shaping circuit configured to shape the waveform of said source oscillation signal generated by said source oscillator; and an offset cancel circuit configured to remove an output dc component of said first waveform shaping circuit.

26. A frequency multiplier circuit as set forth in claim 25, wherein said first waveform shaping circuit includes a limiter amplifier and a low-pass filter.

27. A frequency multiplier circuit comprising:

a source oscillator configured to generate a source oscillator signal using a crystal oscillator;

n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit, wherein said n frequency multiplier circuits are cascade-connected, said source oscillation signal being inputted to a first stage frequency multiplier circuit of said n frequency multiplier circuits, and a final stage frequency multiplier circuit of said n frequency multiplier circuits outputting a signal having a frequency $2^n$ times as high as the frequency of said source oscillation signal, which further comprises:

at least one waveform shaping circuit and at least one phase shift adjusting circuit which are provided so as to correspond to at least part of frequency multiplier circuits of said n frequency multiplier circuits, wherein said waveform shaping circuit shapes the waveform of an output signal of said mixer, and said phase shift adjusting circuit adjusts a phase shift quantity of a corresponding one of said 90° phase shifter circuit.

28. A frequency multiplier circuit as set forth in claim 27, wherein said waveform shaping circuit includes a limiter amplifier and a low-pass filter.

29. A frequency multiplier circuit comprising:

a source oscillator configured to generate a source oscillator signal using a crystal oscillator;

n frequency multiplier circuits (n is an integer which is 2 or more), each of which includes a 90° phase shifter circuit configured to shift the phase of an input signal by 90°, and a mixer configured to generate a doubled signal of said input signal on the basis of said input signal and an output signal of said 90° phase shifter circuit, wherein said n frequency multiplier circuits are cascade-connected, said source oscillation signal being inputted to a first stage frequency multiplier circuit of said n frequency multiplier circuits, and a final stage frequency multiplier circuits of said n frequency multiplier circuits outputting a signal having a frequency $2^n$ times as high as the frequency of said source oscillation signal, which further comprises:

first and second waveform shaping circuits and a phase shift adjusting circuit which are provided so as to correspond to at least part of frequency multiplier circuits of said in frequency multiplier circuits, wherein said first waveform shaping circuit shapes the waveform of said input signal, said second waveform shaping circuit phases an output signal of said 90° phase shifter circuit, and said mixer generates a doubled signal of said input signal on the basis of each of output signals of said first and second waveform shaping circuits.

30. A frequency multiplier circuit as set forth in claim 29, wherein at least one of said first and second waveform shaping circuits includes a limiter amplifier and a low-pass filter.

* * * * *